US010658425B2

(12) United States Patent
Kim et al.

(10) Patent No.: US 10,658,425 B2
(45) Date of Patent: May 19, 2020

(54) METHODS OF FORMING PERPENDICULAR MAGNETIC TUNNEL JUNCTION MEMORY CELLS HAVING VERTICAL CHANNELS

(71) Applicant: Spin Memory, Inc., Fremont, CA (US)

(72) Inventors: Kuk-Hwan Kim, San Jose, CA (US);
Dafna Beery, Palo Alto, CA (US);
Amitay Levi, Cupertino, CA (US);
Andrew J. Walker, Mountain View, CA (US)

(73) Assignee: SPIN MEMORY, INC., Fremont, CA (US)

(*) Notice: Subject to any disclaimer, the term of this patent is extended or adjusted under 35 U.S.C. 154(b) by 0 days.

(21) Appl. No.: 16/237,143

(22) Filed: Dec. 31, 2018

(65) Prior Publication Data
US 2019/0206941 A1   Jul. 4, 2019

Related U.S. Application Data

(63) Continuation-in-part of application No. 15/857,387, filed on Dec. 28, 2017.

(51) Int. Cl.
*H01L 27/22* (2006.01)
*H01L 43/02* (2006.01)
*H01L 29/66* (2006.01)
*H01L 29/78* (2006.01)
*H01L 43/10* (2006.01)
*H01L 43/12* (2006.01)

(52) U.S. Cl.
CPC ...... *H01L 27/228* (2013.01); *H01L 29/66666* (2013.01); *H01L 29/7827* (2013.01); *H01L 43/02* (2013.01); *H01L 43/10* (2013.01); *H01L 43/12* (2013.01)

(58) Field of Classification Search
CPC ............. H01L 27/228; H01L 29/66666; H01L 29/7827
See application file for complete search history.

(56) References Cited

U.S. PATENT DOCUMENTS

| | | |
|---|---|---|
| 6,686,288 B1 | 2/2004 | Prall et al. |
| 6,882,566 B2 | 4/2005 | Nejad et al. |
| 7,965,542 B2 | 6/2011 | Asao |
| 8,350,316 B2 | 1/2013 | Lung et al. |
| 8,946,670 B1 | 2/2015 | Park |
| 9,147,840 B2 | 9/2015 | Knobloch et al. |
| 9,245,610 B2 | 1/2016 | Kim et al. |
| 9,495,627 B1 | 11/2016 | Annunziata et al. |
| 9,722,048 B1 | 8/2017 | Balakrishnan et al. |

(Continued)

OTHER PUBLICATIONS

Kim et al., U.S. Appl. No. 15/857,387, filed Dec. 28, 2017.

(Continued)

*Primary Examiner* — Errol V Fernandes
(74) *Attorney, Agent, or Firm* — Zilka-Kotab, P.C.

(57) ABSTRACT

A method of forming a transistor, according to one embodiment, includes: forming an doped material, depositing an oxide layer on the doped material, depositing a conducting layer on the oxide layer, patterning the conducting layer to form at least two word lines, depositing a nitride layer above the at least two word lines, defining at least two hole regions, at each of the defined hole regions, etching down to the doped material through each of the respective word lines, thereby creating at least two holes, depositing a gate dielectric layer on the nitride layer and in the at least two holes, depositing a protective layer on the gate dielectric layer, etching in each of the at least two holes down to the doped material, and removing a remainder of the protective layer.

12 Claims, 20 Drawing Sheets

(56) References Cited

U.S. PATENT DOCUMENTS

| | | | |
|---|---|---|---|
| 10,460,778 | B2 | 10/2019 | Kim et al. |
| 10,468,293 | B2 | 11/2019 | Kim et al. |
| 2002/0140016 | A1 | 10/2002 | Cha |
| 2003/0223283 | A1 | 12/2003 | Kunikiyo |
| 2005/0042825 | A1 | 2/2005 | Kitamura et al. |
| 2006/0275962 | A1 | 12/2006 | Lee |
| 2007/0145464 | A1 | 6/2007 | Voshell et al. |
| 2008/0203469 | A1 | 8/2008 | Gruening-von Schwerin |
| 2010/0059837 | A1 | 3/2010 | Kim et al. |
| 2010/0091546 | A1 | 4/2010 | Liu et al. |
| 2010/0142294 | A1 | 6/2010 | Carman |
| 2011/0171803 | A1 | 7/2011 | Kakoschke et al. |
| 2011/0269251 | A1 | 11/2011 | Kim et al. |
| 2012/0008367 | A1 | 1/2012 | Kajiyama |
| 2012/0080725 | A1 | 4/2012 | Manos et al. |
| 2012/0155157 | A1 | 6/2012 | Oh |
| 2014/0103471 | A1 | 4/2014 | Lupino et al. |
| 2014/0124827 | A1 | 5/2014 | Holz et al. |
| 2016/0071907 | A1 | 3/2016 | Inaba |
| 2016/0079307 | A1 | 3/2016 | Lu |
| 2016/0181272 | A1 | 6/2016 | Rabkin et al. |
| 2016/0188495 | A1 | 6/2016 | Naeimi et al. |
| 2016/0233333 | A1 | 8/2016 | Toh et al. |
| 2016/0276574 | A1 | 9/2016 | Ohsawa et al. |
| 2017/0062035 | A1 | 3/2017 | Antonyan |
| 2017/0263297 | A1 | 9/2017 | Matsuoka et al. |
| 2017/0278556 | A1 | 9/2017 | Antonyan |
| 2019/0103467 | A1* | 4/2019 | Takaki .............. H01L 29/41741 |
| 2019/0206463 | A1 | 7/2019 | Kim et al. |
| 2019/0206716 | A1 | 7/2019 | Kim et al. |
| 2019/0207024 | A1 | 7/2019 | Kim et al. |

OTHER PUBLICATIONS

Kim et al., U.S. Appl. No. 15/857,410, filed Dec. 28, 2017.
Son et al., "Highly Manufacturable Device Isolation Technology Using Laser-Induced Epitaxial Growth for Monolithic Stack Devices," IEEE Transactions on Electron Devices, vol. 58, No. 11, Nov. 2011, pp. 3863-3868.
Chung, K., "Silicon-Based Epitaxy by Chemical Vapor Deposition Using Novel Precursor Neopentasilane," Dissertation, Princeton University, Jun. 2010, 149 pages.
Kim et al., U.S. Appl. No. 15/859,040, filed Dec. 29, 2017.
Restriction Requirement from U.S. Appl. No. 15/857,410, dated Aug. 15, 2018.
Non-Final Office Action from U.S. Appl. No. 15/859,040, dated Nov. 16, 2018.
Non-Final Office Action from U.S. Appl. No. 15/857,410, dated Dec. 12, 2018.
International Search Report and Written Opinion from PCT Application No. PCT/US18/67100, dated Feb. 26, 2019.
International Search Report and Written Opinion from PCT Application No. PCT/US18/67097, dated Mar. 14, 2019.
Final Office Action from U.S. Appl. No. 15/857,410, dated May 21, 2019.
Notice of Allowance from U.S. Appl. No. 15/857,387, dated Aug. 23, 2019.
Restriction Requirement from U.S. Appl. No. 15/857,387, dated Jun. 27, 2019.
Advisory Action from U.S. Appl. No. 15/857,410, dated Aug. 2, 2019.
Notice of Allowance from U.S. Appl. No. 15/859,040, dated Aug. 15, 2019.
Non-Final Office Action from U.S. Appl. No. 15/859,040, dated Jun. 13, 2019.
Corrected Notice of Allowance from U.S. Appl. No. 15/859,040, dated Sep. 30, 2019.
Non-Final Office Action from U.S. Appl. No. 15/857,410, dated Sep. 30, 2019.
Walker et al., U.S. Appl. No. 16/719,790, filed Dec. 18, 2019.
Final Office Action from U.S. Appl. No. 15/857,410, dated Mar. 16, 2020.

* cited by examiner

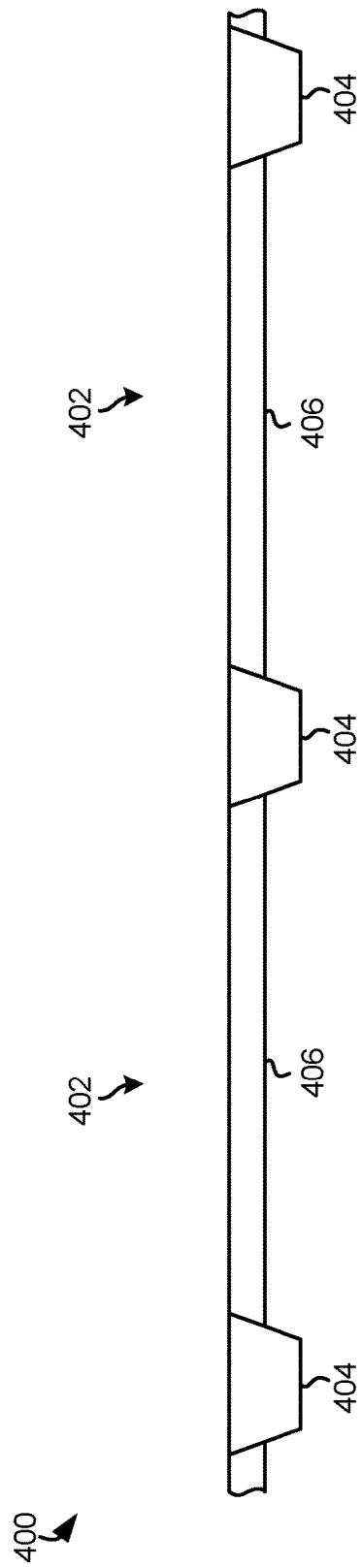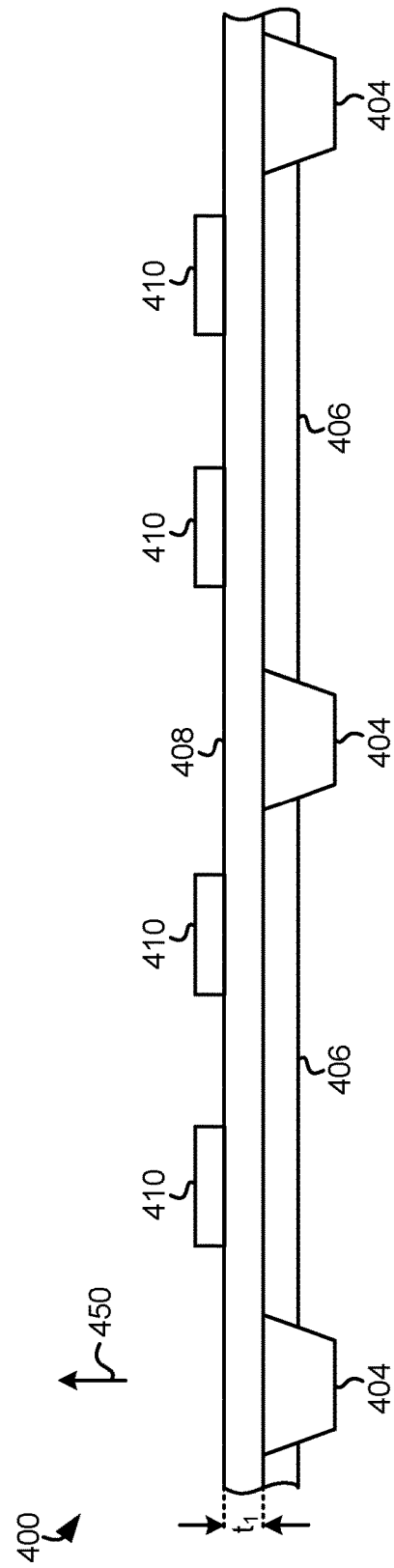

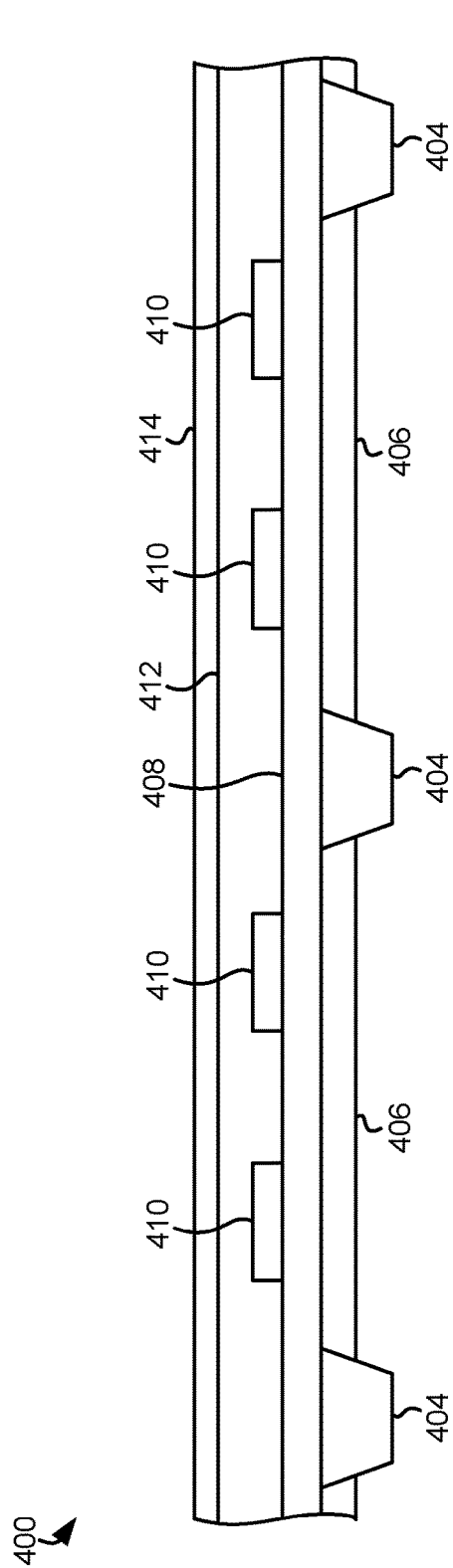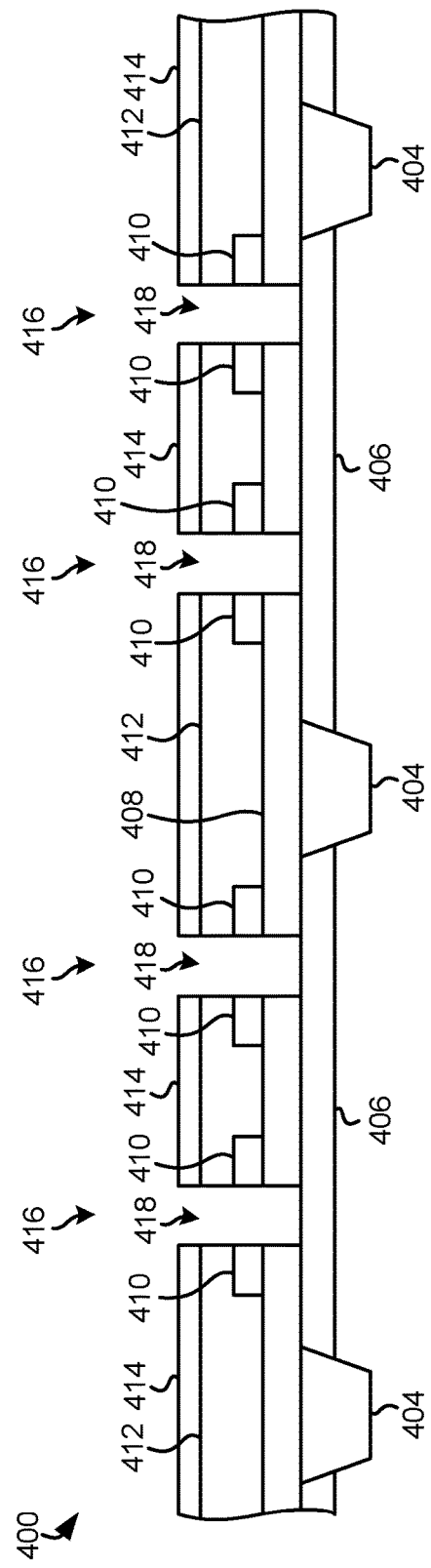

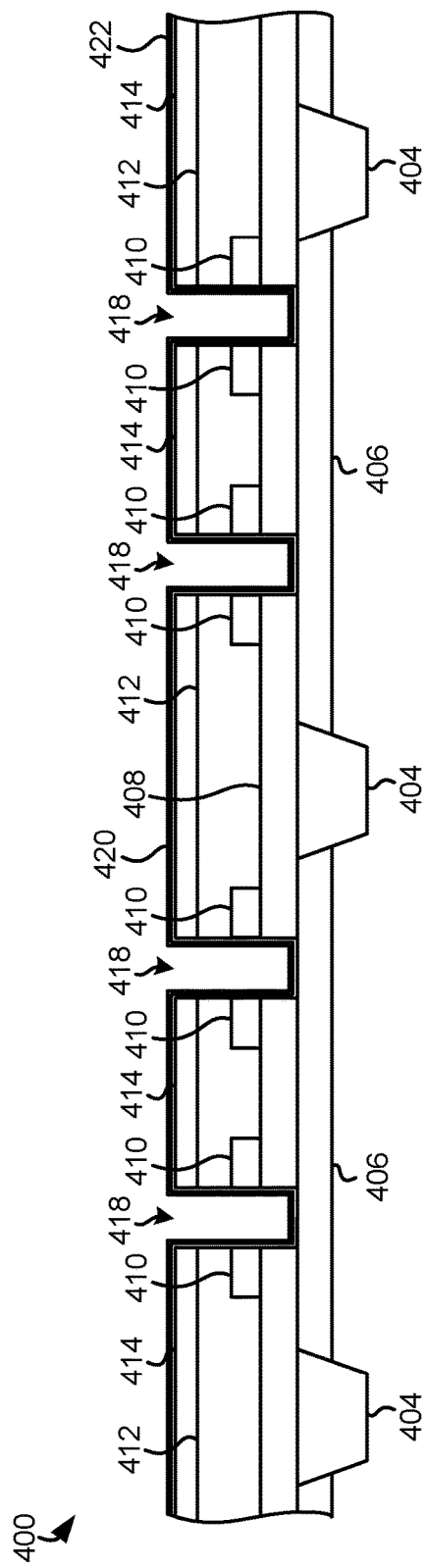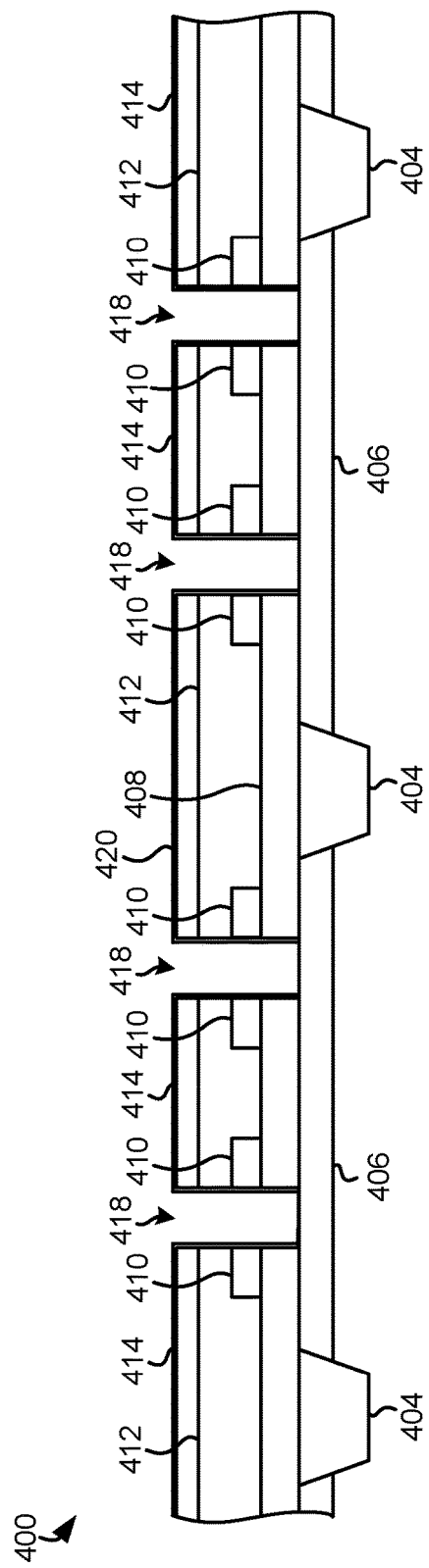

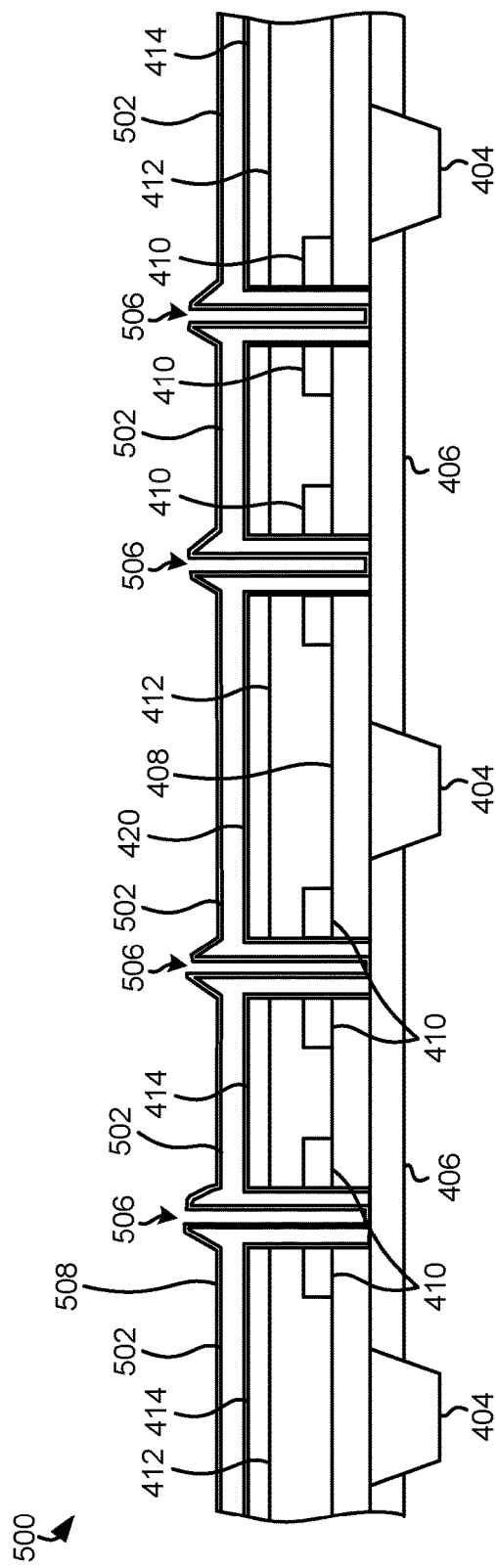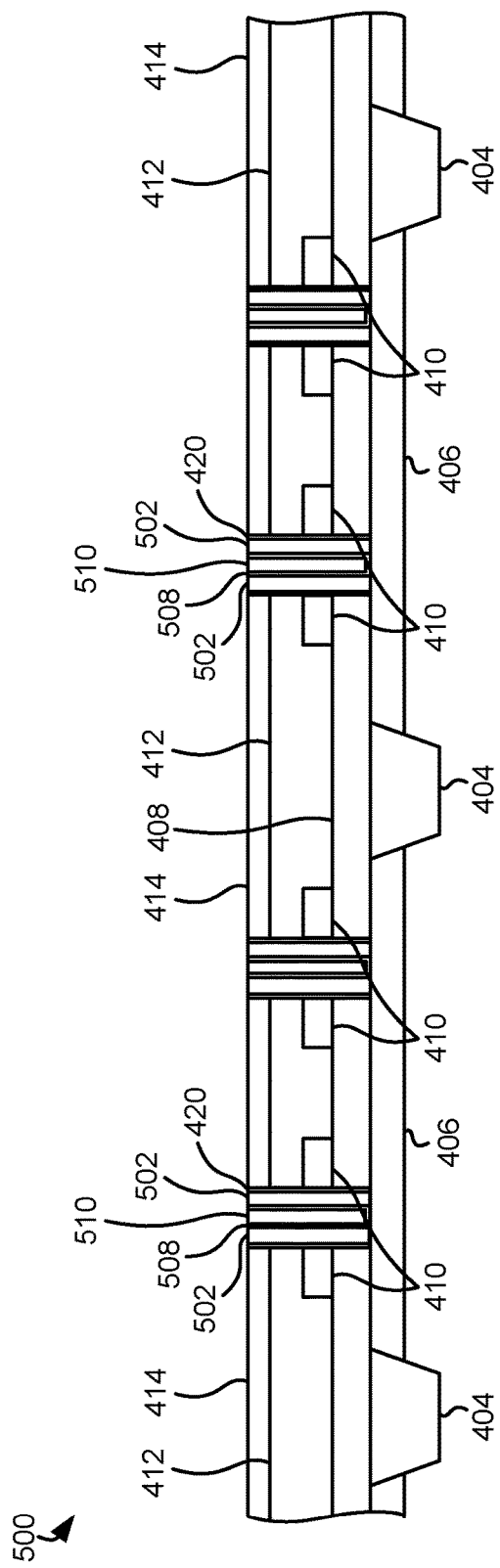
FIG. 5C
FIG. 5D

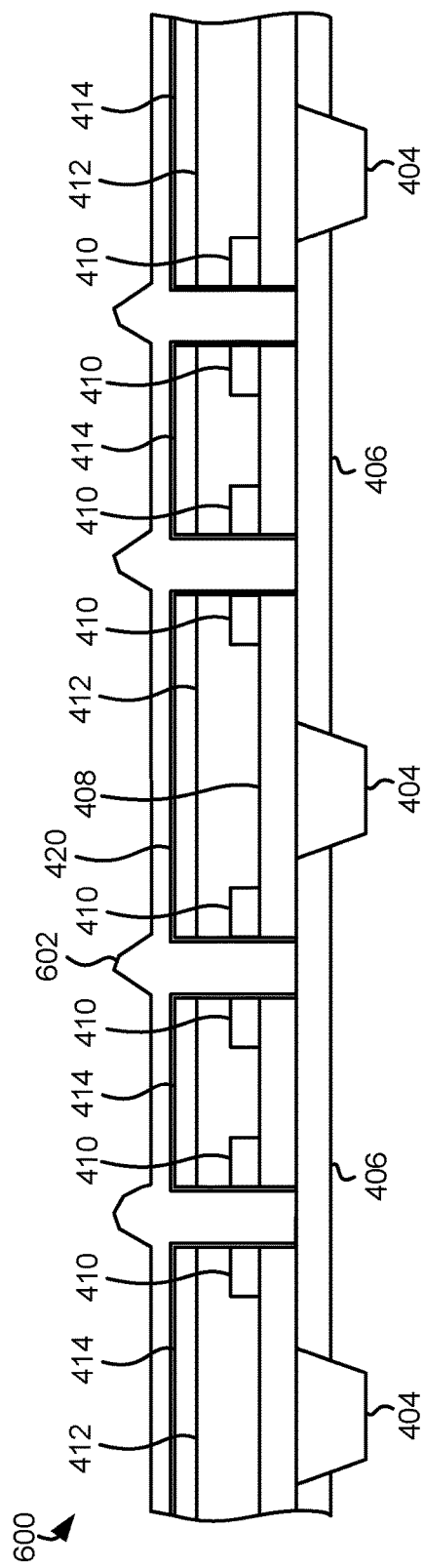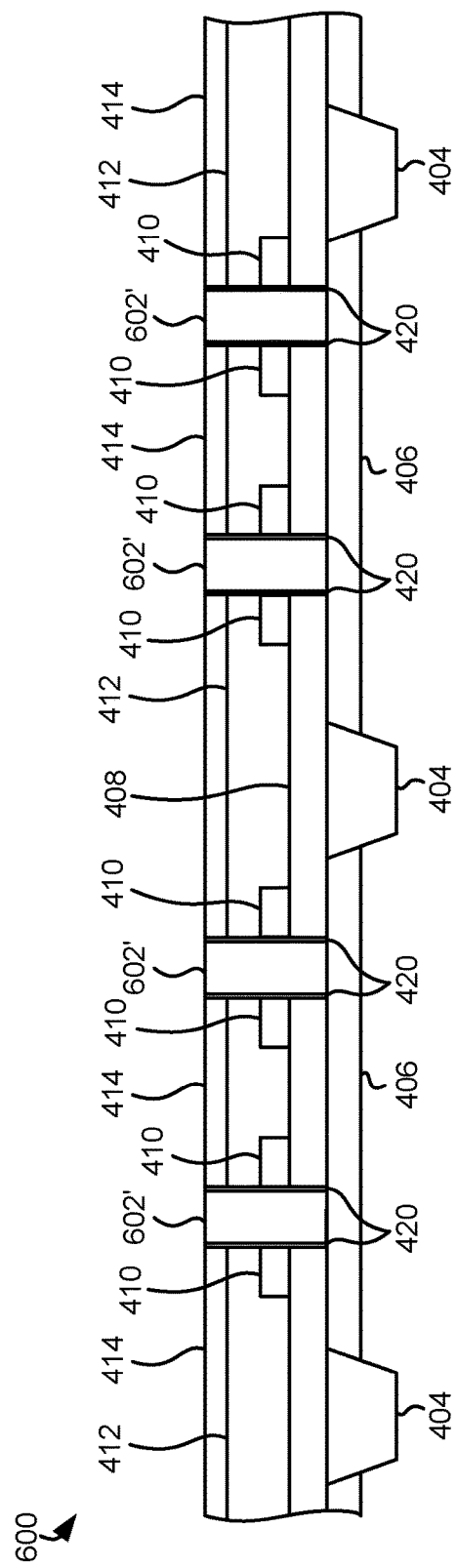
FIG. 6A
FIG. 6B

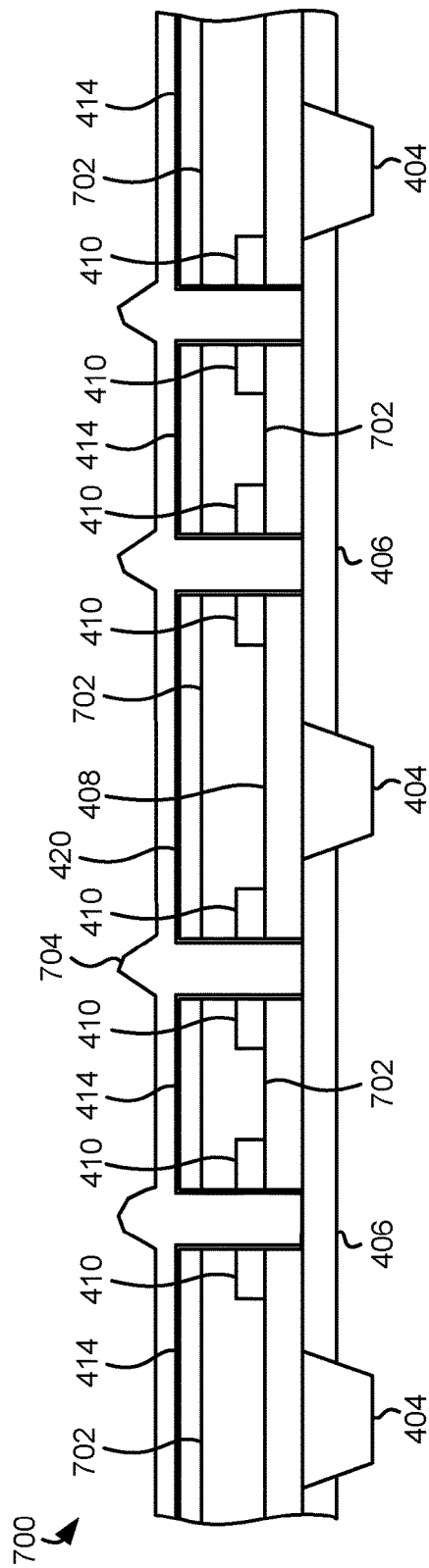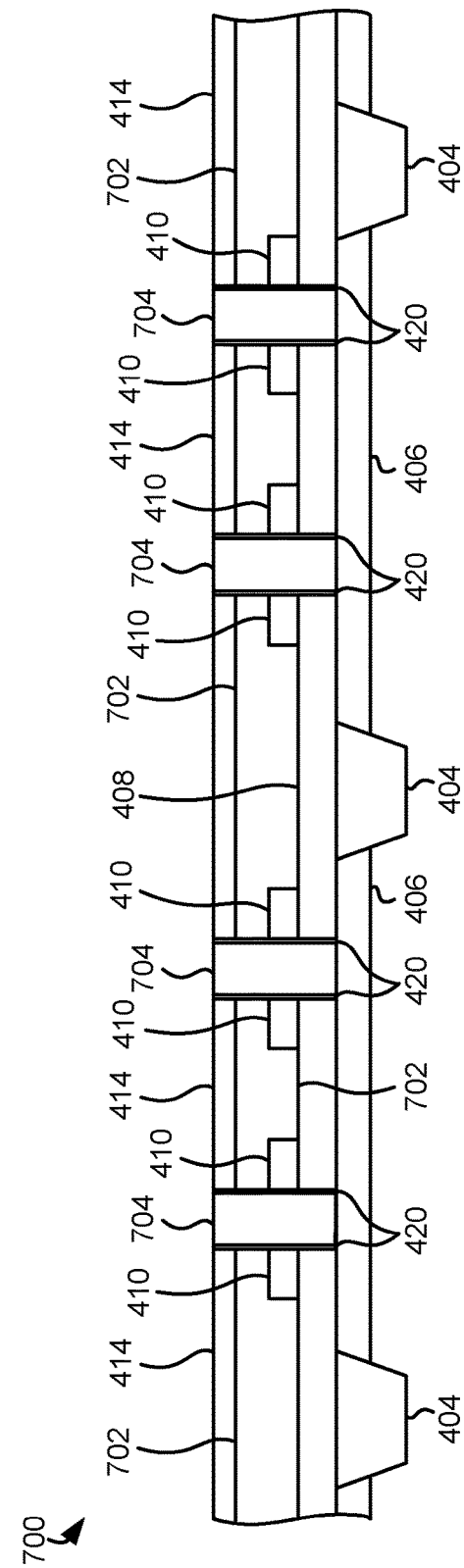
FIG. 7A
FIG. 7B

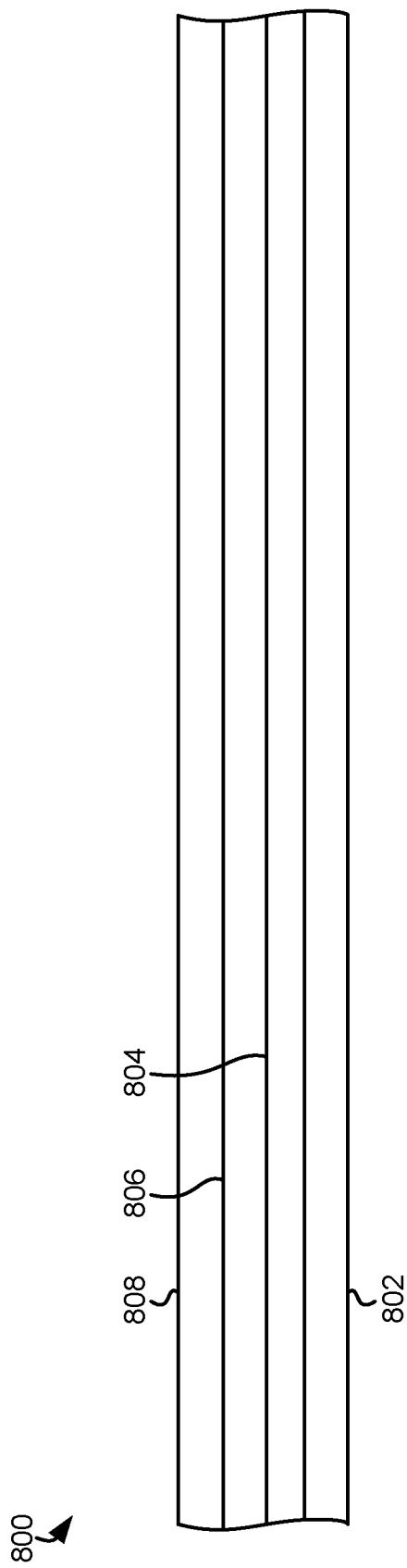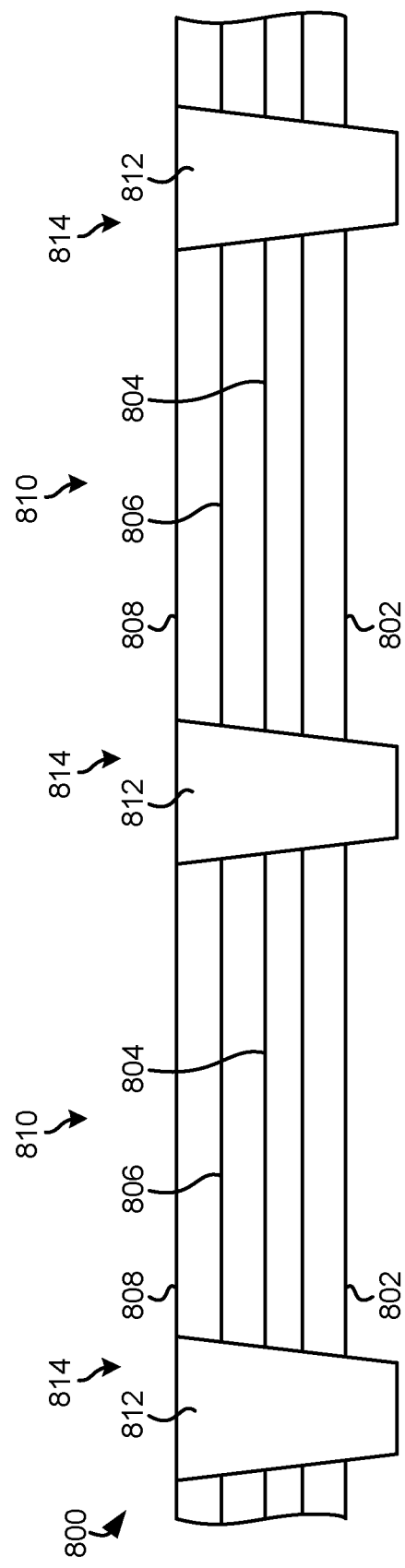

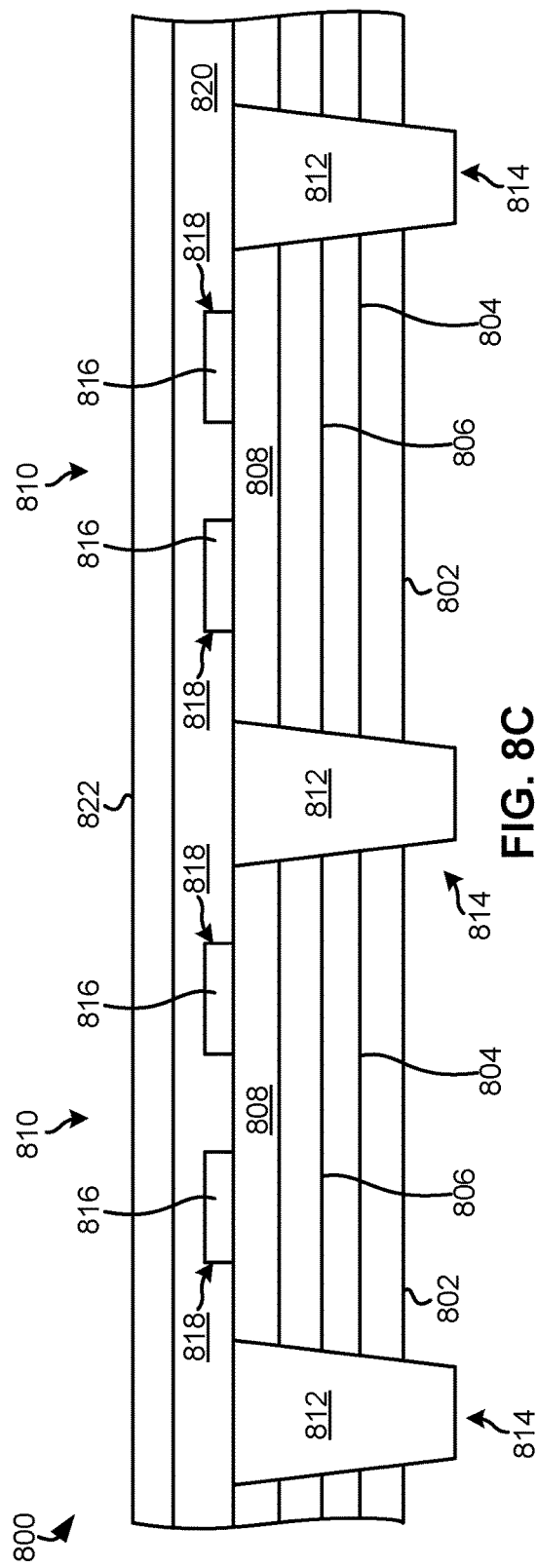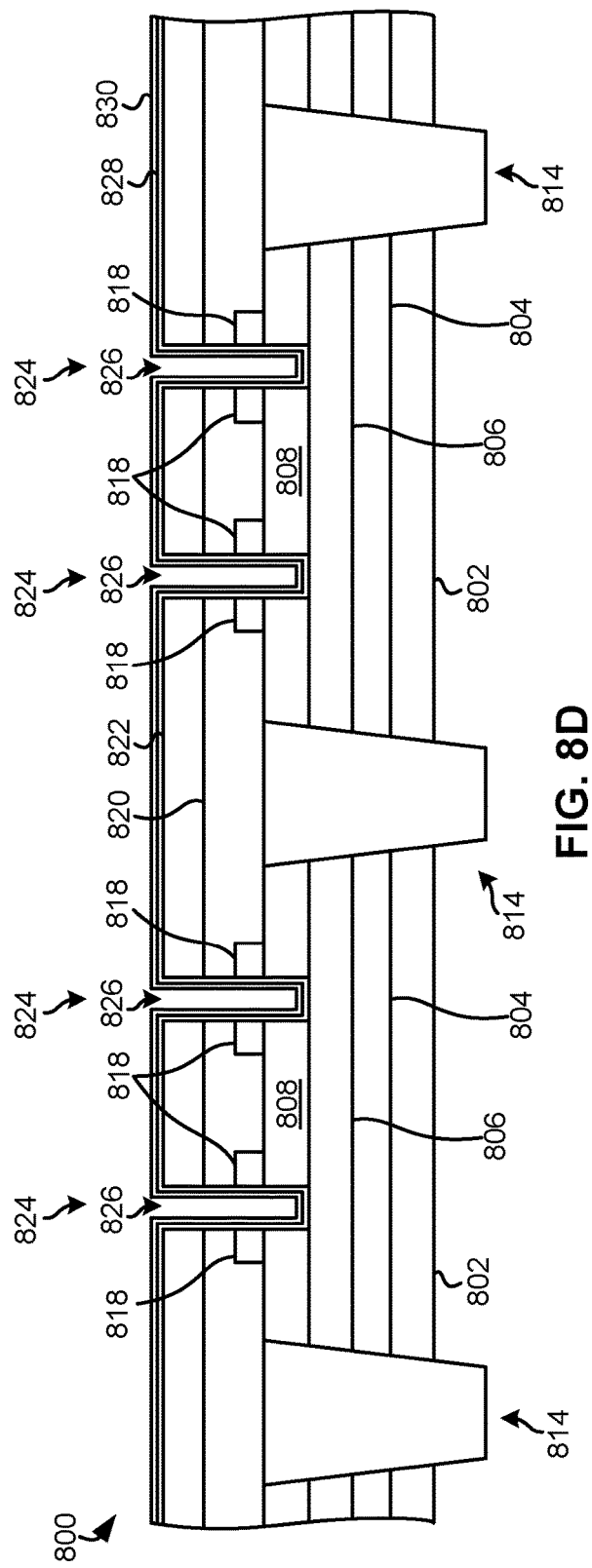

METHODS OF FORMING PERPENDICULAR MAGNETIC TUNNEL JUNCTION MEMORY CELLS HAVING VERTICAL CHANNELS

RELATED APPLICATIONS

The present invention is a Continuation In Part Application of U.S. patent application Ser. No. 15/857,387, entitled METHODS OF FORMING PERPENDICULAR MAGNETIC TUNNEL JUNCTION MEMORY CELLS HAVING VERTICAL CHANNELS, filed Dec. 28, 2017.

FIELD OF THE INVENTION

The present invention relates to magnetoresistive random-access memory (MRAM), and more particularly, this invention relates to increasing the effective storage density of MRAM.

BACKGROUND

MRAM is a non-volatile memory technology that stores data through magnetic storage elements. Because MRAM is non-volatile, memory written thereto may be retained even when a power supply of the MRAM is turned off. The magnetic storage elements used to actually store the data include two ferromagnetic plates, or electrodes, that can hold a magnetic field and are separated by a non-magnetic material, such as a non-magnetic metal or insulator. In general, one of the plates is referred to as the reference layer and has a magnetization which is pinned. In other words, the reference layer has a higher coercivity than the other plate and requires a larger magnetic field or spin-polarized current to change the orientation of its magnetization. The second plate is typically referred to as the free layer and has a magnetization direction which can be changed by relatively smaller magnetic fields or a spin-polarized current relative to the reference layer.

MRAM devices store information by changing the orientation of the magnetization of the free layer. In particular, based on whether the free layer is in a parallel or anti-parallel alignment relative to the reference layer, either a logical "1" or a logical "0" can be stored in each respective MRAM cell. Due to the spin-polarized electron tunneling effect, the electrical resistance of a cell changes due to the orientation of the magnetic fields of the two layers. The resistance of a cell will be different for the parallel and anti-parallel states and thus the cell's resistance can be used to distinguish between a logical "1" and a logical "0".

An important and continuing goal in the data storage industry is that of increasing the density of data stored on a medium. For storage devices which implement MRAM, that goal has led to decreasing the footprint of individual MRAM cells in an attempt to further increase the storage capacity per unit area. However, the development of smaller MRAM cells has reached a limit which has effectively restricted conventional MRAM storage from further increasing storage density.

SUMMARY

A method of forming a transistor, according to one embodiment, includes: forming an doped material, depositing an oxide layer on the doped material, depositing a conducting layer on the oxide layer, patterning the conducting layer to form at least two word lines, depositing a nitride layer above the at least two word lines, defining at least two hole regions, at each of the defined hole regions, etching down to the doped material through each of the respective word lines, thereby creating at least two holes, depositing a gate dielectric layer on the nitride layer and in the at least two holes, depositing a protective layer on the gate dielectric layer, etching in each of the at least two holes down to the doped material, and removing a remainder of the protective layer.

A method of forming a transistor, according to another embodiment, includes: forming a doped material, depositing an oxide layer on the doped material, depositing a conducting layer on the oxide layer, patterning the conducting layer to form at least two word lines, depositing a stress inducing nitride layer on the at least two word lines and on the oxide layer, depositing a nitride layer on the stress inducing nitride layer, defining at least two hole regions, at each of the defined hole regions, etching down to the doped material through each of the respective word lines, thereby creating at least two holes, depositing a gate dielectric layer on the nitride layer and in the at least two holes, depositing a protective layer on the gate dielectric layer, etching in each of the at least two holes down to the doped material, selectively removing a remainder of the protective layer, depositing an amorphous silicon material on the gate dielectric layer and in the at least two holes, annealing the amorphous silicon material, recrystallizing the annealed amorphous silicon material, and exposing the planarized nitride layer by performing a chemical-mechanical planarization process.

A method of forming a transistor, according to yet another embodiment, includes: depositing a doped silicon material on a substrate, depositing an un-doped silicon layer, depositing a second doped silicon layer, depositing an inter layer dielectric layer, defining an active region between a pair of shallow trench isolation (STI) regions, depositing a polysilicon material in the active region, patterning the polysilicon material to form at least two word lines, depositing an oxide layer on the at least two word lines and on the inter layer dielectric layer, depositing a nitride layer on the oxide layer, defining at least two hole regions, at each of the defined hole regions, etching down to the second doped silicon layer through each of the respective word lines, thereby creating at least two holes, depositing a gate dielectric layer on the nitride layer and in the at least two holes, depositing a protective layer on the gate dielectric layer, etching in each of the at least two holes down to the second doped silicon layer, selectively removing a remainder of the protective layer, inducing epitaxial silicon structure growth in the at least two holes extending vertically from the second doped silicon layer, and exposing the planarized nitride layer by performing a chemical-mechanical planarization process.

Other aspects and advantages of the present invention will become apparent from the following detailed description, which, when taken in conjunction with the drawings, illustrate by way of example the principles of the invention.

BRIEF DESCRIPTION OF THE DRAWINGS

FIGS. 4A-4H are partial perspective views of a method for forming a vertical channel transistor structure according to one embodiment.

FIGS. 5A-5D are partial perspective views of a method for forming a vertical channel transistor structure according to one embodiment.

FIGS. 6A-6B are partial perspective views of a method for forming a vertical channel transistor structure according to one embodiment.

FIGS. 7A-7B are partial perspective views of a method for forming a vertical channel transistor structure according to one embodiment.

FIGS. 8A-8H are partial perspective views of a method for forming a vertical channel transistor structure according to one embodiment.

DETAILED DESCRIPTION

Figure 1:
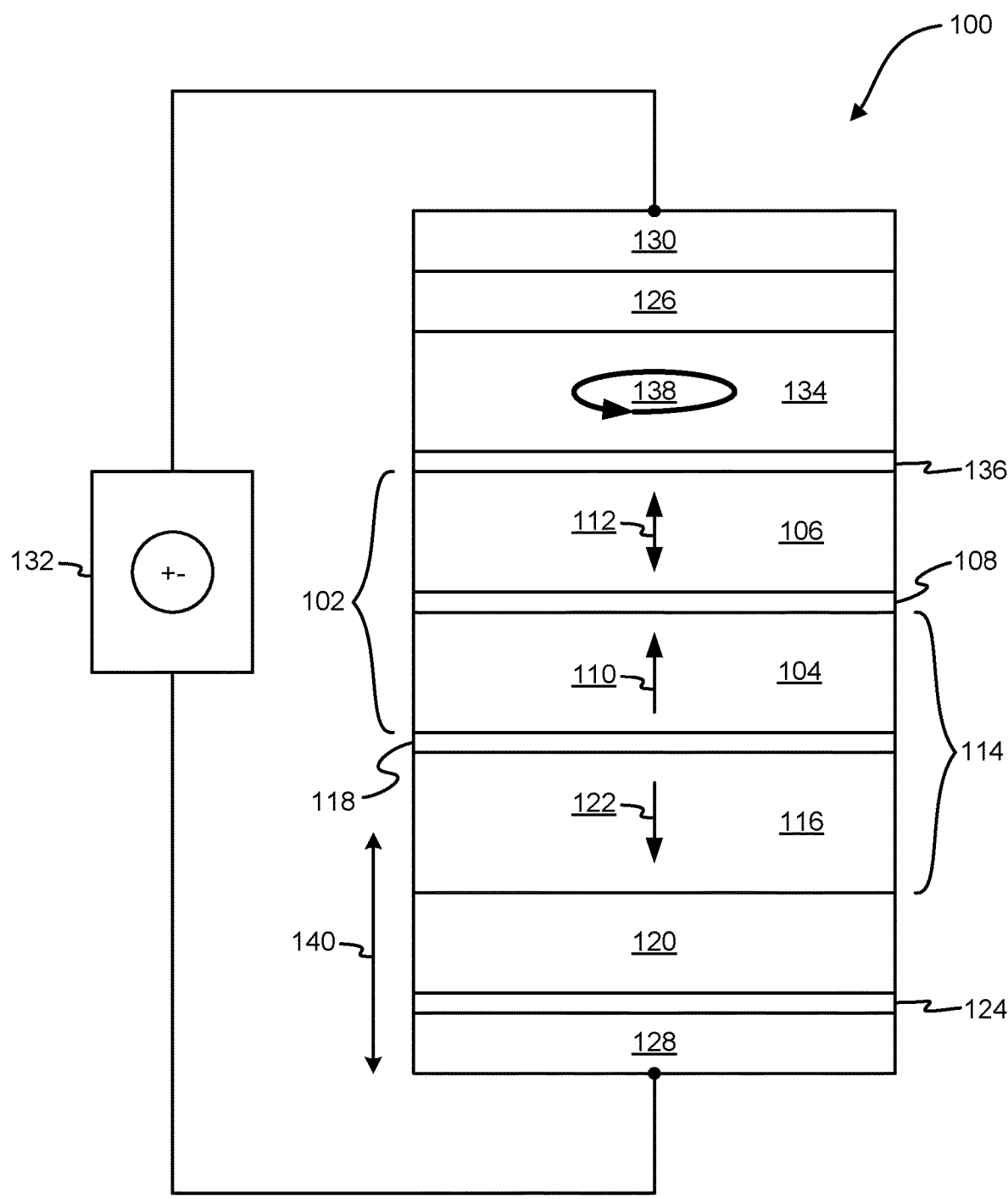
FIG. 1 is a representational view of a sensor stack for a memory element according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of MRAM having improved data storage density and/or related systems and methods.

In one general embodiment, a method of forming a transistor includes: forming an doped material, depositing an oxide layer on the doped material, depositing a conducting layer on the oxide layer, patterning the conducting layer to form at least two word lines, depositing a nitride layer above the at least two word lines, defining at least two hole regions, at each of the defined hole regions, etching down to the doped material through each of the respective word lines, thereby creating at least two holes, depositing a gate dielectric layer on the nitride layer and in the at least two holes, depositing a protective layer on the gate dielectric layer, etching in each of the at least two holes down to the doped material, and removing a remainder of the protective layer.

In another general embodiment, a method of forming a transistor includes: forming a doped material, depositing an oxide layer on the doped material, depositing a conducting layer on the oxide layer, patterning the conducting layer to form at least two word lines, depositing a stress inducing nitride layer on the at least two word lines and on the oxide layer, depositing a nitride layer on the stress inducing nitride layer, defining at least two hole regions, at each of the defined hole regions, etching down to the doped material through each of the respective word lines, thereby creating at least two holes, depositing a gate dielectric layer on the nitride layer and in the at least two holes, depositing a protective layer on the gate dielectric layer, etching in each of the at least two holes down to the doped material, selectively removing a remainder of the protective layer, depositing an amorphous silicon material on the gate dielectric layer and in the at least two holes, annealing the amorphous silicon material, recrystallizing the annealed amorphous silicon material, and exposing the planarized nitride layer by performing a chemical-mechanical planarization process.

In yet another general embodiment, a method of forming a transistor includes: depositing a doped silicon material on a substrate, depositing an un-doped silicon layer, depositing a second doped silicon layer, depositing an inter layer dielectric layer, defining an active region between a pair of shallow trench isolation (STI) regions, depositing a polysilicon material in the active region, patterning the polysilicon material to form at least two word lines, depositing an oxide layer on the at least two word lines and on the inter layer dielectric layer, depositing a nitride layer on the oxide layer, defining at least two hole regions, at each of the defined hole regions, etching down to the second doped silicon layer through each of the respective word lines, thereby creating at least two holes, depositing a gate dielectric layer on the nitride layer and in the at least two holes, depositing a protective layer on the gate dielectric layer, etching in each of the at least two holes down to the second doped silicon layer, selectively removing a remainder of the protective layer, inducing epitaxial silicon structure growth in the at least two holes extending vertically from the second doped silicon layer, and exposing the planarized nitride layer by performing a chemical-mechanical planarization process.

As previously mentioned, MRAM devices store information by changing the orientation of the magnetization of the free layer. In particular, based on whether the free layer is in a parallel or anti-parallel alignment relative to the reference layer, either a logical "1" or a logical "0" can be stored in each respective MRAM cell. Due to the spin-polarized electron tunneling effect, the electrical resistance of a cell changes due to the orientation of the magnetic fields of the two layers. The resistance of a cell will be different for the parallel and anti-parallel states and thus the cell's resistance can be used to distinguish between a logical "1" and a logical "0".

Spin transfer torque or spin transfer switching, uses spin-aligned (polarized) electrons to change the magnetization orientation of the free layer in the MTJ. In general, electrons possess a spin, which is a quantized amount of angular momentum intrinsic to the electron. An electrical current is generally not polarized, in that it generally includes of 50% spin up and 50% spin down electrons. However, passing a current though a magnetic layer polarizes electrons in the current with the spin orientation corresponding to the magnetization direction of the magnetic layer. Thus, the magnetic layer acts as a polarizer and produces a spin-polarized current as a result. Moreover, if a spin-polarized current is passed to the magnetic region of a free layer in the MTJ device, the electrons will transfer a portion of their spin-angular momentum to the magnetization layer to produce a torque on the magnetization of the free layer. Thus, this spin transfer torque can switch the magnetization of the free layer, thereby effectively writing either a logical "1" or a logical "0" based on whether the free layer is in the parallel or anti-parallel states relative to the reference layer.

Referring to FIG. 1, an illustrative sensor stack for a MTJ memory element 100 is shown according to one embodiment. The MTJ memory element 100 may be used in a p-MTJ memory element, as described in various embodiments herein. The MTJ memory element 100 may include a MTJ 102 that may include a magnetic reference layer 104, a magnetic free layer 106, and a thin, non-magnetic, electrically-insulating magnetic tunnel barrier layer 108 positioned between the reference layer 104 and the free layer 106 in a layer thickness direction 140. The tunnel barrier layer 108 may include an oxide, such as MgO, $Al_2O_3$, etc., or some other suitable material known in the art. The reference layer 104 has a magnetization 110 that is fixed in a direction that is perpendicular to a horizontal plane of the layer, as indicated by the arrow. The horizontal plane is sometimes referred to as a plane of formation in the embodiments described herein. The free layer 106 has a magnetization 112 that may be in either of two directions perpendicular to a horizontal plane of the free layer 106, as indicated by the two arrows. While the magnetization 112 of the free layer 106 remains in either of two directions perpendicular to the plane of the free layer 106 in a quiescent state, it may be selectable switched between these two directions, as is described in greater detail herein. When the magnetization 112 of the free layer 106 is in the same direction as the magnetization 110 of the reference layer 104, the electrical resistance across the MTJ 102 is at a low resistance state. Conversely, when the magnetization 112 of the free layer 106 is opposite to the magnetization 110 of the reference layer 104, the electrical resistance across the MTJ 102 is in a high resistance state.

The reference layer 104 may be part of an anti-parallel magnetic pinning structure 114 that may include a magnetic keeper layer 116 and a non-magnetic, antiparallel coupling layer 118 positioned between the keeper layer 116 and the reference layer 104 in the thickness direction 140. The antiparallel coupling layer 118 may include any suitable material known in the art, such as Ru, and may be constructed to have a thickness that causes ferromagnetic antiparallel coupling of the keeper layer 116 and the reference layer 104.

In one approach, the keeper layer 116 may be exchange coupled with an antiferromagnetic layer 120, which may include any suitable material known in the art, such as IrMn. Exchange coupling between the antiferromagnetic layer 120 and the keeper layer 116 strongly pins the magnetization 122 of the keeper layer 116 in a first direction. The antiparallel coupling between the keeper layer 116 and the reference layer 104 pins the magnetization 110 of the reference layer 104 in a second direction opposite to the direction of magnetization 122 of the keeper layer 116.

According to one approach, a seed layer 124 may be positioned below the keeper layer 116 in the thickness direction 140 to initiate a desired crystalline structure in the layers deposited thereabove.

In another approach, a capping layer 126 may be positioned above the free layer 106 to protect the underlying layers during manufacture, such as during high temperature annealing.

A lower electrode 128 and an upper electrode 130 may be positioned near a bottom and a top of the MTJ memory element 100, respectively, in one approach. The lower electrode 128 and the upper electrode 130 may be constructed of a non-magnetic, electrically conductive material of a type known in the art, such as TaN, TiN, W, etc., and may provide an electrical connection with a circuit 132. The circuit 132 may include a current source, and may further include circuitry for reading an electrical resistance across the MTJ memory element 100.

The magnetic free layer 106 has a magnetic anisotropy that causes the magnetization 112 of the free layer 106 to remain stable in one of two directions perpendicular to the horizontal plane of the free layer 106. In a write mode of use for the MTJ memory element 100, the orientation of the magnetization 112 of the free layer 106 may be switched between these two directions by applying an electrical current through the MTJ memory element 100 via the circuit 132. A current in a first direction causes the magnetization 112 of the free layer 106 of the MTJ memory element 100 to flip to a first orientation, and a current in a second direction opposite to the first direction causes the magnetization 112 of the free layer 106 of the MTJ memory element 100 to flip to a second, opposite direction.

For example, if the magnetization 112 is initially oriented in an upward direction in FIG. 1, applying a current in a downward direction through the MTJ memory element 100 causes electrons to flow in an opposite direction upward through the MTJ memory element 100. Electrons travelling through the reference layer 104 become spin polarized as a result of the magnetization 110 of the reference layer 104. These spin-polarized electrons cause a spin torque on the magnetization 112 of the free layer 106, which causes the magnetization 112 to flip directions, from the upward direction to a downward direction.

On the other hand, if the magnetization 112 of the free layer 106 is initially in a downward direction in FIG. 1, applying an electrical current through the MTJ memory element 100 in an upward direction in FIG. 1 causes electrons to flow in an opposite direction, downward through the MTJ memory element 100. However, because the magnetization 112 of the free layer 106 is opposite to the magnetization 110 of the reference layer 104, the electrons will not be able to pass through the tunnel barrier layer 108. As a result, the electrons (which have been spin polarized by the magnetization 112 of the free layer 106) will accumulate at the junction between the free layer 106 and the tunnel barrier layer 108. This accumulation of spin polarized electrons causes a spin torque that causes the magnetization 112 of the free layer 106 to flip from the downward direction to an upward direction.

In order to assist the switching of the magnetization 112 of the free layer 106, the MTJ memory element 100 may include a spin polarization layer 134 positioned above the free layer 106. The spin polarization layer 134 may be separated from the free layer 106 by an exchange coupling layer 136. The spin polarization layer 134 has a magnetic anisotropy that causes it to have a magnetization 138 with a primary component oriented in the in plane direction (e.g., perpendicular to the magnetization 112 of the free layer and the magnetization 110 of the reference layer 104). The magnetization 138 of the spin polarization layer 134 may be fixed in one approach, or may move in a processional manner as shown in FIG. 1. The magnetization 138 of the spin polarization layer 134 causes a spin torque on the free layer 106 that assists in moving its magnetization 112 away from its quiescent state perpendicular to the plane of the free layer 106. This allows the magnetization 112 of the free layer 106 to more easily flip with less energy being utilized to flip the magnetization 112 in response to applying a write current to the MTJ memory element 100.

The MTJ memory element 100 described in FIG. 1 is intended to provide context to the various embodiments described herein. The structures and methods described herein in accordance with various embodiments may include a portion of the MTJ memory element 100 described in FIG. 1 and/or used in conjunction with the MTJ memory element 100, in various approaches.

It should be noted that the MTJ sensor stack configuration illustrated in FIG. 1 is in no way intended to limit the invention. Rather, the sensor stack included in MTJ memory element 100 of FIG. 1 is presented by way of example only. Accordingly, any of the embodiments described herein which include reference to a MTJ structure (e.g., sensor stack) may implement a MTJ sensor structure similar to or the same as that shown in FIG. 1, or any other MTJ sensor structure which would be apparent to one skilled in the art after reading the present description.

A MTJ sensor stack, e.g., such as that illustrated in FIG. 1, may be electrically coupled with a transistor in order to write information to the MTJ sensor stack such that the information is stored in the sensor stack itself. As previously mentioned, information may be written (or overwritten) to a MTJ sensor stack by causing the magnetic orientation of the free layer to flip. Moreover, flipping the magnetic orientation of the free layer may be achieved by selectively passing a current through the sensor stack, e.g., as will be described in further detail below.

Figure 2:
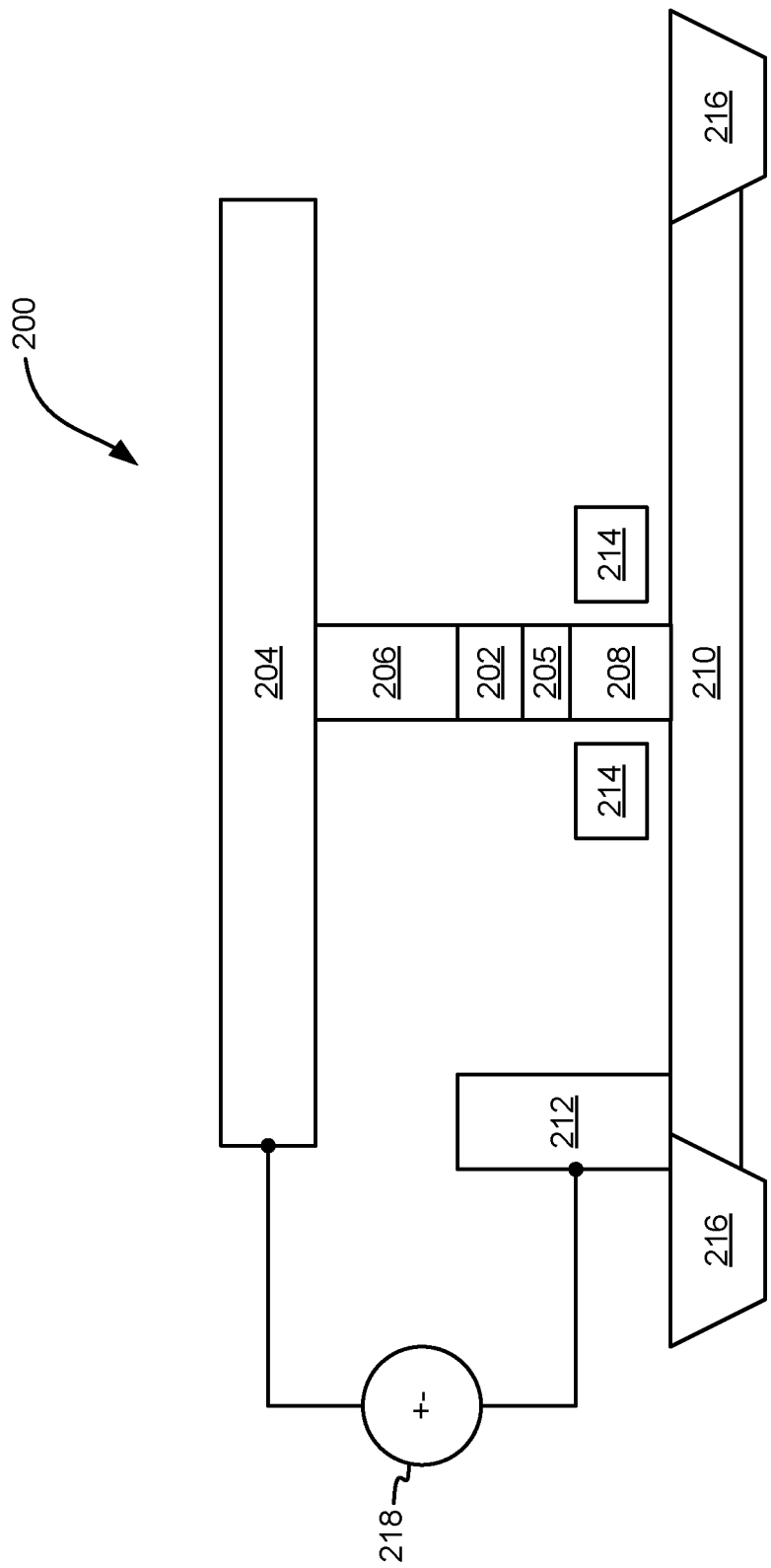
FIG. 2 is a schematic view of a memory cell according to one embodiment.

Looking now to FIG. 2, a portion of a MRAM cell 200 that includes a p-MTJ sensor stack 202 is shown according to one embodiment. The MRAM cell 200 may be operated and utilized as understood by those of skill in the art, with any special use cases being specified in accordance with an embodiment herein. The memory element 100 described in FIG. 1 may be used as the magnetoresistive sensor stack 202 of FIG. 2 in accordance with embodiments that store data in MRAM. In one embodiment, an MTJ element may be used as the magnetoresistive sensor stack 202. Moreover, although the embodiment illustrated in FIG. 2 includes a MRAM cell 200 which includes a vertical transistor, it should also be noted that a vertical transistor is in no way required, but rather has been presented by way of example. Accordingly, the any type of transistor structure may be implemented depending on the desired approach, e.g., as would be appreciated by one skilled in the art after reading the present description.

The MRAM cell 200 also includes a bit line 204 that supplies current across the magnetoresistive sensor stack 202 from a current source 218. The bit line 204 may include any suitable material known in the art, such as TaN, W, TiN, Au, Ag, Cu, etc. An extension layer 206 electrically connects the magnetoresistive sensor stack 202 with the bit line 204. The extension layer 206 may include any suitable material known in the art, such as Ru, Ta, etc. A source terminal 205 is coupled between the magnetoresistive sensor stack 202 and a channel layer 208, the channel layer 208 further being in electrical contact with an n+ layer 210. The channel layer 208 may include any suitable semiconductor material known in the art, such as Si, Ge, GaAs-compounds, etc. The n+ layer 210 may include any suitable material known in the art, such as TaN, W, TiN, Au, Ag, Cu, etc., and is electrically connected to the voltage source 218 via a source line 212, which may include any suitable material known in the art, such as TaN, W, TiN, Au, Ag, Cu, etc. Positioned across the channel layer 208 is a word line 214 which may include any suitable material known in the art, such as TaN, W, TiN, Au, Ag, Cu, etc. On either side of the n+ layer 210 are shallow trench isolation (STI) layers 216 which provide electrical insulation between adjacent ones of the n+ layer 210 although only one n+ layer 210 is shown in the present embodiment. Moreover, although not specifically shown, electrically insulative material may be positioned around the various layers shown in FIG. 2, as would be understood by one of skill in the art.

Figure 3A:
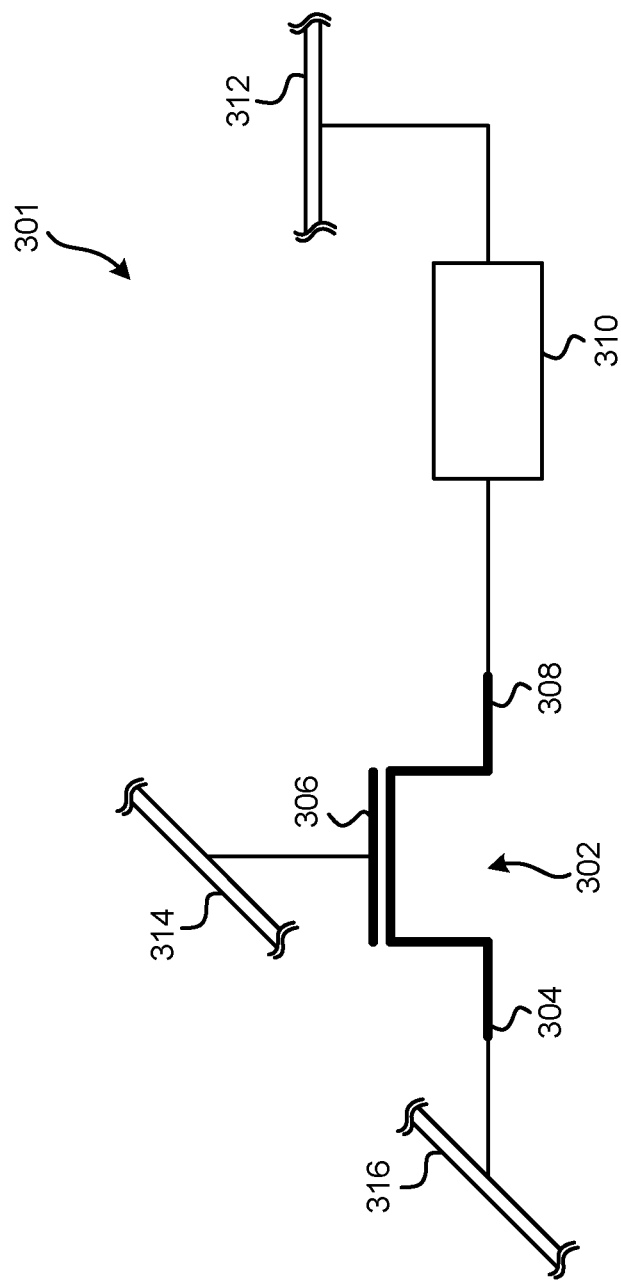
FIG. 3A is a schematic view of a perpendicular magnetic tunnel junction (p-MTJ) cell according to one embodiment.

Looking now to FIG. 3A, a basic schematic view of a perpendicular MTJ (p-MTJ) cell 301 of memory is illustrated in accordance with one embodiment. As an option, the present p-MTJ cell 301 may be implemented in conjunction with features from any other embodiment listed herein, such as those described with reference to the other FIGS., e.g., such as FIG. 1. Of course, however, such p-MTJ cell 301 and others presented herein may be used in various applications and/or in permutations which may or may not be specifically described in the illustrative embodiments listed herein. Further, the p-MTJ cell 301 presented herein may be used in any desired environment.

As shown, the p-MTJ cell 301 includes a transistor 302 which has a drain terminal 304, a gate terminal 306, and a source terminal 308. Moreover, a MTJ sensor stack 310 is electrically coupled to both the source terminal 308 of the transistor structure 302 as well as a bit line 312. The gate terminal 306 is also shown as being electrically coupled to a word line 314, while the drain terminal 304 is electrically coupled to a source line 316. Each of the bit line 312, the word line 314 and the source line 316 are preferably able to supply a voltage to a respective terminal of the transistor structure 302 in order to induce or inhibit a current from flowing through the transistor structure 302. Moreover, although the drain terminal 304 and source terminal 308 are labeled as shown in FIG. 3A, it should be noted that the source and drain terminals may be interchangeable in approaches where both terminals include (are) n+ doped regions, e.g., from a material composition point of view. However, a voltage is applied to one of the terminals 304, 308 which is a higher voltage than a voltage applied to the other of the terminals 304, 308, the terminal having a higher voltage bias applied thereto will effectively be the drain terminal and the other of the two terminals having the lower voltage bias applied thereto will effectively be the source terminal, e.g., as would be appreciated by one skilled in the art after reading the present description.

It follows that the combination of signals (voltages) applied to each of the terminals 304, 306, 308 of the transistor structure 302 may be selectively adjusted in order to ultimately control whether a current is applied to the MTJ sensor stack 310 coupled to the source terminal 308, and in which direction. Thus, the signals passed through each of the terminals 304, 306, 308 may ultimately control the spin of electrons in a free layer of the sensor stack 310, thereby writing either a logical "1" or logical "0" thereto, e.g., as described above. Accordingly, the resulting structure 301 presented in FIG. 3A may effectively represent a single p-MTJ cell which may be used in MRAM.

It should also be noted that the specific layers which are included in the sensor stack 310 may vary depending on the desired approach. For instance, in some approaches the sensor stack 310 may include the same or a similar structure as the sensor stack of the MTJ memory element 100 illustrated in FIG. 1. However, in other approaches the sensor stack 310 may include any configuration of layers which would be apparent to one skilled in the art after reading the present description.

As described above, an important and continuing goal in the data storage industry is that of increasing the density of data stored on a medium. For storage devices which implement MRAM, that goal has led to decreasing the footprint of individual MRAM cells in an attempt to further increase the storage capacity per unit area. However, the development of smaller MRAM cells has reached a limit which has effectively restricted conventional MRAM storage from further increasing storage density.

In sharp contrast to these restrictions experienced by conventional MRAM storage, various embodiments included herein are able to achieve data storage densities which are much higher than previously possible. By implementing a common (e.g., shared) source line extending between various transistors according to some of the different approaches described below, the resulting memory arrays may provide the desirable performance of MRAM in a compact configuration, e.g., as will be described in further detail below.

Figure 3B:
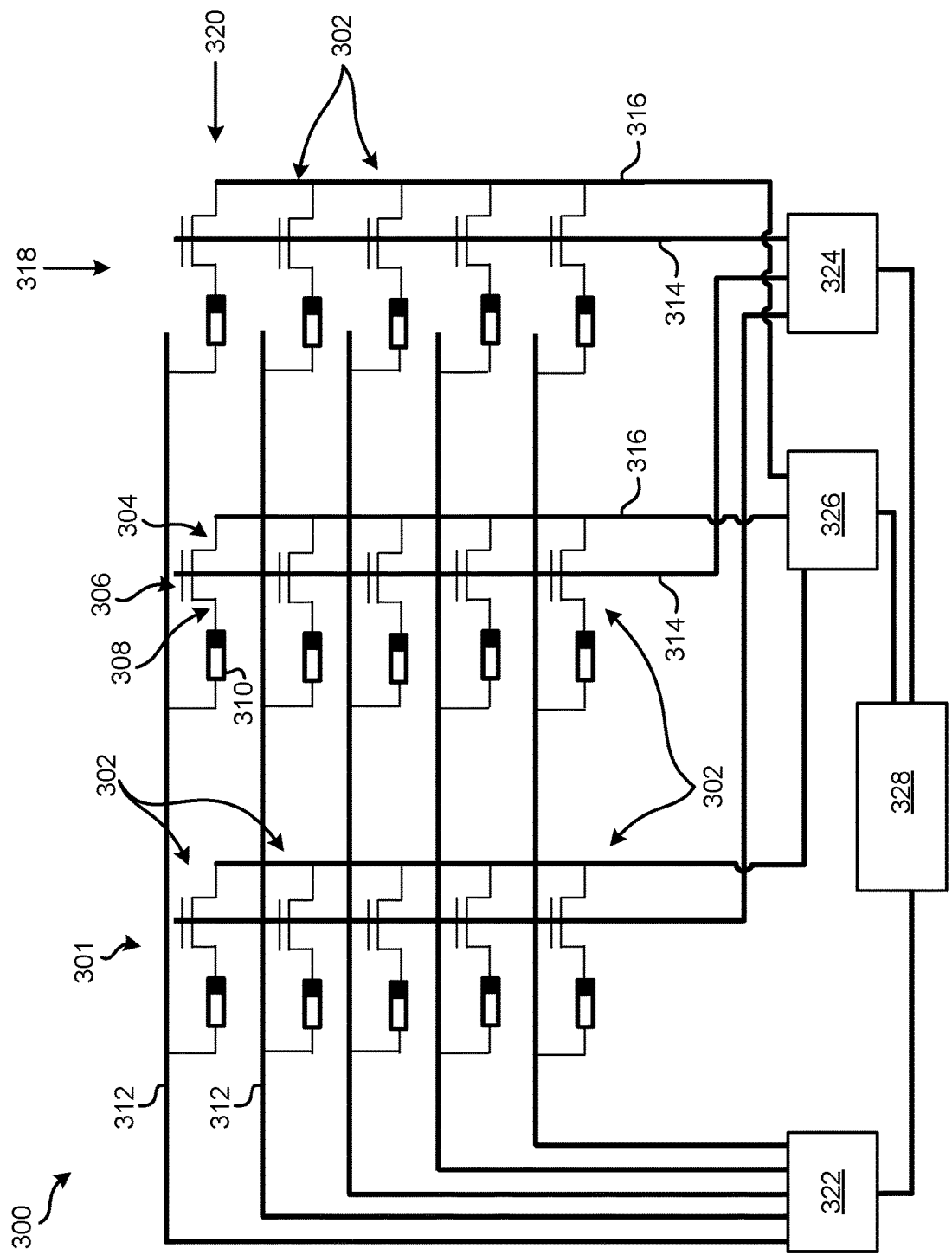
FIG. 3B is a schematic view of a MRAM array having a plurality of the p-MTJ cells in FIG. 3A, according to one embodiment.

Referring now to FIG. 3B, a schematic view of a MRAM array 300 is illustrated in accordance with one embodiment. As an option, the present MRAM array 300 may be implemented in conjunction with features from any other embodiment listed herein, such as those described with reference to the other FIGS., e.g., such as FIGS. 1-3A. Of course, however, such MRAM array 300 and others presented herein may be used in various applications and/or in permutations which may or may not be specifically described in the illustrative embodiments listed herein. Further, the MRAM array 300 presented herein may be used in any desired environment.

As shown, the MRAM array 300 (e.g., magnetic device) includes a plurality of memory cells 301, each of which includes a transistor 302 and a MTJ sensor stack 310. The plurality of memory cells 301 are oriented in a grid-type fashion. Each of the transistors 302 includes a drain terminal 304, a gate terminal 306 and a source terminal 308, respectively. Moreover, each of the transistors is coupled to a MTJ sensor stack 310. According to preferred approaches, each coupled MTJ sensor 310 and transistor 302 pair are a p-MTJ cell. These p-MTJ cells differ from conventional types of memory cells in that terminals of the transistors included in the p-MTJ cells are formed in a vertical fashion along the deposition direction of the transistor structure, rather than perpendicular to the deposition direction. Thus, the transistors in the p-MTJ cells have a significantly smaller footprint compared to conventional transistors, while delivering enough current to MTJ sensor stack. According to some illustrative approaches, the effective cell size of each of the p-MTJ cells may be about 2F×2.5F, or equivalently about $5F^2$, where F represents the minimum feature size defined by the lithography limits associated with the technology used to fabricate each of the p-MTJ cells. Thus, depending on the actual process(es) used to form the various p-MTJ cells, their effective size may vary depending on the value of F. This effective cell size of each of the p-MTJ cells is significantly smaller than conventionally achievable. Having a smaller footprint also allows for a larger number of transistors to be positioned in a given area, thereby increasing storage density, reducing an overall footprint of the memory module, etc.

The MTJ sensor stack 310 is electrically coupled between the source terminal 308 of each of the transistors 302 as well as a respective common bit line 312. Moreover, each of the gate terminals 306 are electrically coupled to a respective common word line 314, while each of the drain terminals 304 are electrically coupled to a respective common source line 316. Each of the common bit line 312, the common word line 314 and the common source line 316 are preferably able to supply voltages to a respective terminal of the various transistors 302 in the MRAM array 300 in order to induce or inhibit a current from flowing through select ones of the transistors 302. Accordingly, the voltages apply to the common bit lines 312, the common word lines 314 and/or the common source lines 316 may control whether a logical "1" or a logical "0" is written to select ones of the MRAM sensor stacks 310 coupled to the various transistors 302. It follows that the combined structure of the transistors 302 and the MRAM sensor stacks 310 may effectively form a "memory cell" as described above. Moreover, the memory cell is able to store one bit of information, i.e., a logical "1" or a logical "0". Thus, the storage capacity of the MRAM array 300 may effectively be defined by the number of transistor 302 and MTJ sensor stack 310 pairings (or p-MTJ cells) included therein.

With continued reference to FIG. 3B, the various different memory cells 301 are arranged in a grid-like fashion. In other words, the different memory cells 301 are oriented in rows and columns which are substantially perpendicular to each other. This grid-like organization of the different memory cells 301 provides an efficient use of space and allows for the memory density of the resulting MRAM array 300 to be maximized. However, it should be noted that this grid-like arrangement of the memory cells 301 shown in FIG. 3B is in no way intended to limit the invention. Rather, the memory cells 301 and/or any of the lines 312, 314, 316 may be arranged differently depending on the desired approach.

As mentioned above, the grid-like arrangement of the transistors 302 forms distinct columns 318 and rows 320 which extend throughout the MRAM array 300. Moreover, the columns 318 and rows 320 are interleaved such that each of the transistors 302 are part of a defined row as well as a defined column. Thus, a specific one of the transistors may be individually identified given the row and column which it is located in. Although only three columns 318 and five rows 320 are illustrated in the present embodiment, any desired number of rows and/or columns may be implemented in order to scale the size of (e.g., the number of memory cells in) the MRAM array 300, and thus the storage capacity of the MRAM array 300. According to an example, hundreds, thousands, millions, etc. of p-MTJ cells (transistor 302 and MTJ sensor stack 310 pairings) may be organized in various rows and columns which extend perpendicularly relative to each other.

Each of the common bit lines 312, the common word lines 314 and the common source lines 316 are illustrated as being coupled to (e.g., in electrical communication with) a multiplexer 322, 324, 326 respectively. Moreover, each of the multiplexers 322, 324, 326 are coupled to a central controller 328. However, it should be noted that any one or more of these lines 312, 314, 316 may extend to any desired electrical component. Each of the multiplexers 322, 324, 326 may serve as an electrical circuit which is used to control a voltage that is applied to each of the respective lines 312, 314, 316, e.g., using logic gates for instance. Similarly, the controller 328 may be configured to perform various processes which effect the voltages applied by the multiplexers 322, 324, 326 to each of the respective lines 312, 314, 316, and in turn, the different terminals of the various transistors 302.

By acting as a voltage generator, the multiplexers 322, 324, 326 may be configured to counteract signal dampening experienced in the respective lines 312, 314, 316 coupled thereto. In other approaches, one or more of the multiplexers 322, 324, 326 may serve as a sense amplifier in addition to a voltage generator. As a result, each of the multiplexers 322, 324, 326 may be able to perform a read operation by receiving a signal from various ones of the transistors 302, as well as perform write operations by applying a desired voltage to the respective lines 312, 314, 316 coupled thereto. Although each of the common source lines 316 are shown as being coupled to the same multiplexer 326 in FIG. 3B, it may be preferred that a sense amplifier enabled multiplexer circuit be coupled to each of the respective common source lines 316. Accordingly, in some approaches each of the common source lines 316 may be coupled to a different sense amplifier enabled multiplexer.

As described above, an important and continuing goal in the data storage industry is that of increasing the density of data stored on a medium. For storage devices which implement MRAM, that goal has led to decreasing the footprint of individual MRAM cells in an attempt to further increase the storage capacity per unit area. However, the development of smaller MRAM cells has reached a limit which has effectively restricted conventional MRAM storage from further increasing storage density.

In sharp contrast to these restrictions experienced by conventional MRAM storage, various embodiments included herein are able to achieve data storage densities which are much higher than previously possible. By implementing a common (e.g., shared) source line extending between various transistors according to some of the different approaches described below, the resulting memory arrays may provide the desirable performance of MRAM in a compact configuration. Moreover, by implementing vertical channel transistor structures in combination with these shared voltage supply contacts, storage densities are increased even further, e.g., as will be described in further detail below.

Looking now to FIGS. 4A-4H, various processes of an exemplary fabrication method 400 for forming a vertical channel transistor is illustrated in accordance with one embodiment. The method 400 may be performed in accordance with the present invention in any of the environments depicted in FIGS. 1-3B, among others, in various embodiments. Of course, more or less operations than those specifically described in FIGS. 4A-4H may be included in method 400, as would be understood by one of skill in the art upon reading the present descriptions.

Each of the steps of the method 400 may be performed by any suitable component of the operating environment. For example, in various embodiments, the method 400 may be partially or entirely performed by a controller, a processor, etc., or some other device having one or more processors therein which is able to communicate with (e.g., send commands to and/or receive information from) various fabrication components which would be apparent to one skilled in the art after reading the present description. The processor, e.g., processing circuit(s), chip(s), and/or module(s) implemented in hardware and/or software, and preferably having at least one hardware component may be utilized in any device to perform one or more steps of the method 400. Illustrative processors include, but are not limited to, a central processing unit (CPU), an application specific integrated circuit (ASIC), a field programmable gate array (FPGA), etc., combinations thereof, or any other suitable computing device known in the art. Moreover, it should be noted that the various approaches described in relation to method 400 may be used to form any desired type of complementary metal-oxide-semiconductor CMOS and/or MOS devices.

As shown in FIG. 4A, method 400 begins with defining active regions 402. As shown, each of the active regions 402 exist between shallow trench isolation (STI) structures 404 which are spaced apart by a desired distance. A doped material 406 (e.g., layer) is also formed in each of the active regions 402. The doped material may be formed in a full film fashion using any desired process(es). However, it should be noted that an upper surface of each of the STI structures 404 is preferably exposed. Thus, a planarization process may be performed on the doped material 406 such that the upper surface of each of the STI structures 404 is exposed, e.g., as shown in FIG. 4A.

In preferred approaches, the doped material 406 is a doped silicon material. However, in other approaches the doped material 406 may include different base materials. Moreover, the material used to dope the silicon material may vary, e.g., depending on whether it is desired that the resulting transistor is a p-type transistor or an n-type transistor. Accordingly, in some approaches the doped material 406 may be doped with p-type materials, such as boron, gallium, indium, etc., while in other approaches the doped material 406 may be doped with n-type materials, such as phosphorus, Arsenide, bismuth, etc.

Moving to FIG. 4B, an oxide layer 408 is deposited on an upper surface of the doped material 406 as well as the exposed upper surfaces of the STI structures 404. According to an illustrative approach which is in no way intended to limit the invention, the oxide may be deposited such that the resulting oxide layer 408 has a deposition thickness ti which is between about 20 nm and about 30 nm, more preferably less than about 50 nm, but could be thicker or thinner depending on the desired approach. As a result, the deposition thickness of the oxide layer 408 may be tuned which allows for added accuracy with respect to achieving an oxide thickness which is related to a gate overlap (e.g., see word line 410 below) over the extended doped material 406 (e.g., common source line). This gate/source overlap region is an important factor in determining different transistor characteristics, e.g., such as parasitic gate capacitance ($C_{gs}$), band-to-band-tunneling, negative bias temperature instability (NBTI), source series resistance, etc. For example, the oxide layer 408 is preferably thick enough to provide enough isolation between outer extents of the word line 410 and the doped material 406, but also preferably not so thick that parasitic resistance of an extension region extruding above the doped material 406. However, the oxide layer 408 is also preferably not so thin that reduced coupling occurs between word line 410 and the doped material 406. Thus, in some approaches the source extension region may actually be accurately determined by controlling in-situ doping process such that the thickness of source extension region is sufficiently matched with the deposition thickness of the oxide layer 408. Therefore, process variations and/or device parameters used while forming the oxide layer 408 as well as the layers subsequently grown during vertical channel formation thereto may be controlled more accurately in the approaches included herein, which results in improved performance of the resulting transistor structures, particularly in comparison to conventional products.

A plurality of word lines 410 are also formed on the oxide layer 408. According to an exemplary approach, the word lines 410 may be formed by depositing a thin electrically conducting material on the oxide layer 408 in a full film fashion. Thereafter, the full film electrically conducting layer may be patterned to form the plurality of cylindrical word lines 410, a cross section of which is shown in FIG. 4B. In some approaches, the full film electrically conducting layer may be patterned using a mask and etching process, but any desired type of patterning process may be used.

In preferred approaches, the word lines 410 include a poly-gate material. However, in other approaches the word lines 410 may include other types of semiconductor materials. In still other approaches, the word lines 410 may include any desired type of material, e.g., such as metallic materials which may include W, TiNi, TiW, TaN, TiN, etc. Although various types of electrically conductive material may be used depending on the desired approach, it is preferred that the electrically conductive material is also non-magnetic, e.g., so as to not interfere with a magnetic tunnel junction sensor stack that may be coupled to the final transistor structure.

Looking now to FIG. 4C, method 400 further includes depositing another oxide layer 412 on the patterned word lines 410 and on the previously deposited oxide layer 408. Depending on the approach, the oxide layers 408, 412 may be deposited using the same, similar, or different processes. Moreover, the second oxide layer 412 preferably has a greater deposition thickness than the previously deposited oxide layer 408, but is in no way required. A nitride layer 414 is also deposited on the second oxide layer 412 as shown.

Once the nitride layer 414 has been deposited, a planarization process is preferably performed to the upper surface of the resulting structure shown in FIG. 4C. The planarization process may desirably define a smooth, uniform surface, e.g., which may have a positive effect on layers formed above.

Moving to FIG. 4D, hole regions 416 may be defined above each of the previously defined word lines 410. Thus, the number of hole regions 416 defined preferably corresponds to the number of defined word lines 410 therebelow. According to some approaches, the hole regions 416 may be defined by a mask. In other words, the hole regions 416 may be defined by the voids that are in a mask which is applied to the upper surface of the resulting structure shown in FIG. 4C.

A removal process, e.g., such as an etching process (dry etching process, wet etching process, etc.), may be performed in order to actually form the holes at each of the defined hole regions 416. The removal process is preferably conducted such that the holes formed in the structure shown in FIG. 4D extend through each of the respective word lines 410, and down to an upper surface of the doped material 406. Holes 418 which split each of the respective word lines 410 are thereby formed as a result of the removal process. As a result, a vertical channel may be formed (e.g., grown) through a center of each of the cylindrical word lines 410, thereby forming a word line 410 having a hole 418 extending through the center thereof. It should be noted that although the word lines 410 appear to be positioned on either side of the holes 418, this is because only a cross section of each of the word lines 410 are shown. In other words, a portion of each word line 410 encircles (e.g., surrounds) a middle portion of the vertical channel such that a portion of the word line 410 is effectively positioned on either side of the vertical channel along the deposition plane. Moreover, tab portions of the word line 410 preferably extend away from each of the vertical channels first formed by the holes 418, the tab portions extending along the deposition plane thereof. The holes 418 also form a recess in each of the oxide layers 408 which may also surround each of the holes 418.

The word lines 410 may serve as gate terminals for the resulting transistor structure, e.g., as would be appreciated by one skilled in the art after reading the present description. This process of forming a buried gate line is desirable in that it allows for a thin film word line material to be deposited and subsequently formed into a 1.5 F line shape, where "F" represents the minimum feature size defined by the lithography limits associated with the technology used to fabricate each of the word lines 410. Thus, depending on the actual process(es) used to form the various word lines 410, their effective size may vary depending on the value of F. This effective size of each of the word lines 410 is significantly smaller than conventionally achievable by having word line 410 pre-defined in the flat surface before forming vertical channels, and subsequently aligning smaller holes for vertical channels over the existing word line 410. Moreover, the process desirably improves the word line formation process compared to conventional products by providing a much more scalable word line formation process, e.g., as would be appreciate by one skilled in the art after reading the present description.

Looking now to FIG. 4E, a gate dielectric layer 420 is deposited on the nitride layer 414 and on the exposed surfaces in the holes 418. By depositing the gate dielectric layer 420 onto the exposed inner facing surfaces of the holes 418, the gate dielectric layer 420 has an annular cylindrical shape as a result. In other words, by depositing a layer on the inner surface of the cylindrical recess formed by the holes 418 through the various layers as shown, the resulting gate dielectric layer 420 adopts an annular cylindrical shape despite appearing as two distinct layers on either side of the holes 418 as a result of the two dimensional cross-sectional view shown in FIG. 4E.

Furthermore, a protective layer 422 is deposited on the gate dielectric layer 420. The gate dielectric layer 420 may include any type of gate dielectric material which would be apparent to one skilled in the art after reading the present description. Moreover, the protective layer 422 is preferably deposited to protect the gate dielectric layer 420 during subsequent fabrication processes, e.g., as will soon become apparent. According to some approaches, the gate dielectric layer 420 may have a deposition thickness which is between about 1 nm and about 2 nm, but could be thicker or thinner depending on the desired approach. Moreover, the gate dielectric layer 420 may include $ZrO_2$, $Al_2O_3$, $HfO_2$, etc. As a result, a resulting metallic gate may be formed which includes W, TiN, Ti, Mo, Ru, TiNi, etc. Moreover, the deposition thickness of the resulting metallic gate may be between about 50 nm and about 100 nm, but may be thicker or thinner depending on the desired approach. For instance, the deposition thickness of the resulting metallic gate may determine, at least in part, the channel length. Moreover, it is desirable that the channel length is well determined by considering short channel effects, leakage current requirement, current drive capability, etc. According to illustrative approaches, which are in no way intended to limit the invention, if a polysilicon gate material is used, SiO2 and/or SiON may preferably be used as gate dielectric materials.

Moving to FIG. 4F, an etching process may be performed at least in each of the holes 418. Accordingly, the doped material 406 at the base of each of the holes 418 is preferably exposed as a result of the etching process performed therein. However, a remainder of the gate dielectric layer 420 remains intact, e.g., because of the protective layer 422. The alignment of the holes 418 over the buried word lines 410 may be relieved by reducing the size (e.g., width) of the holes formed. As mentioned above, each of the word lines 410 may have a size of 1.5 F, and a diameter of the holes 418 may be about 1 F. Therefore, there is only a 0.25 F amount of misalignment allowed on either side of the holes 418 that are formed. Thus, if the hole size (diameter) is reduced further, to 0.7 F or 0.5 F for example, once a 1 F diameter hole is lithographically defined with sub-lithographic hole size processes, overlay burden may desirably be reduced accordingly. Moreover, sub-lithographic hole definition processes may subsequently be transfer the hole layer of photoresists and possibly further to oxide and/or nitride hard-masks. Additionally, by subsequently depositing oxide and/or nitride layers followed by an etching process to form smaller well-controlled hole sizes as described herein may further improve performance of the resulting transistor structures (e.g., see FIGS. 5A-5D below).

Once the etching process has concluded, any remaining portions of the protective layer 422 are selectively removed, thereby exposing the remaining portions of the annular cylindrical gate dielectric layer 420 along the vertical sides of the holes 418 and above the nitride layer 414. It follows that the protective layer 422 may include materials which are resistant to etching processes or similar removal processes, or which will at act in a sacrificial manner to protect the underlying gate dielectric layer 420. As a result, the desirable material characteristics of the gate dielectric layer 420 may be conserved by the protective layer 422, despite the fact that an etching process is performed. For example, the gate dielectric layer 420 may have characteristics which are protected by the protective layer 422, and later used to induce a uniform crystalline structure growth thereover. According to an exemplary approach, remaining portions of the protective layer 422 may be selectively removed by using a solution that only reacts with the protective layer 422. In other words, the exposed portions of the doped material 406 layer are preferably not directly exposed to the etching chamber environment (e.g., ambient air). Rather, the remaining portions of the protective layer 422 may be selectively removed using a wet etchant and/or isotropic dry etching process, e.g., as would be appreciated by one skilled in the art after reading the present description.

A cleaning process is also preferably performed on the exposed surfaces of the resulting structure shown in FIG. 4F. In other words, a cleaning process is also preferably performed on the gate dielectric layer 420 and exposed portions of the doped material 406 in each of the holes 418. The cleaning process may remove any particulates, contaminants, etc. that may have formed on the exposed surfaces of the structure, particularly in the holes 418. As a result, more desirable vertical channel growth may be achieved. However, it should be noted that in some approaches a cleaning process may not be performed.

Figure 4G:
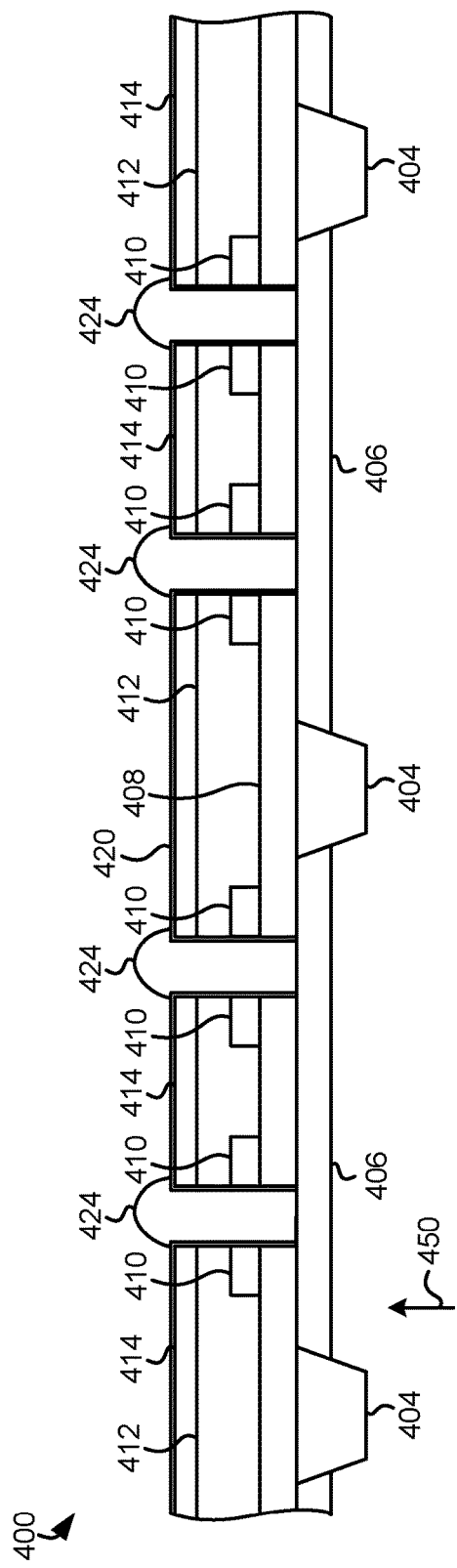

Proceeding now to FIG. 4G, vertical channels 424 are formed in each of the holes 418. The vertical channels 424 preferably include silicon which is actually grown vertically along the deposition direction 450 in each of the holes rather than being deposited therein. According to a specific approach, the vertical channels 424 may be formed by inducing epitaxial growth of the silicon from the doped material 406 at the base of each of the holes. The epitaxial silicon growth may be induced using nitrogen sidewall passivation of each of the holes 418, e.g., as would be appreciated by one skilled in the art after reading the present description. Moreover, the vertical channels 424 preferably grow (e.g., extend) past an upper surface of the nitride layer 414 as well as exposed upper cylindrical surfaces of the annular cylindrical gate dielectric layers 420. Accordingly, the resulting vertical channel 424 is epitaxially grown. Epitaxial silicon channel 424 growth also allows for in-situ source and/or drain doping to be performed (e.g., applied) along the vertical deposition direction. More specifically, in-situ source and drain doping regions may be well aligned with the deposition thickness of the oxide layer 408 and/or the deposition thickness of the word lines 410 to create a well aligned and desirable source/drain doping profile.

Figure 4H:
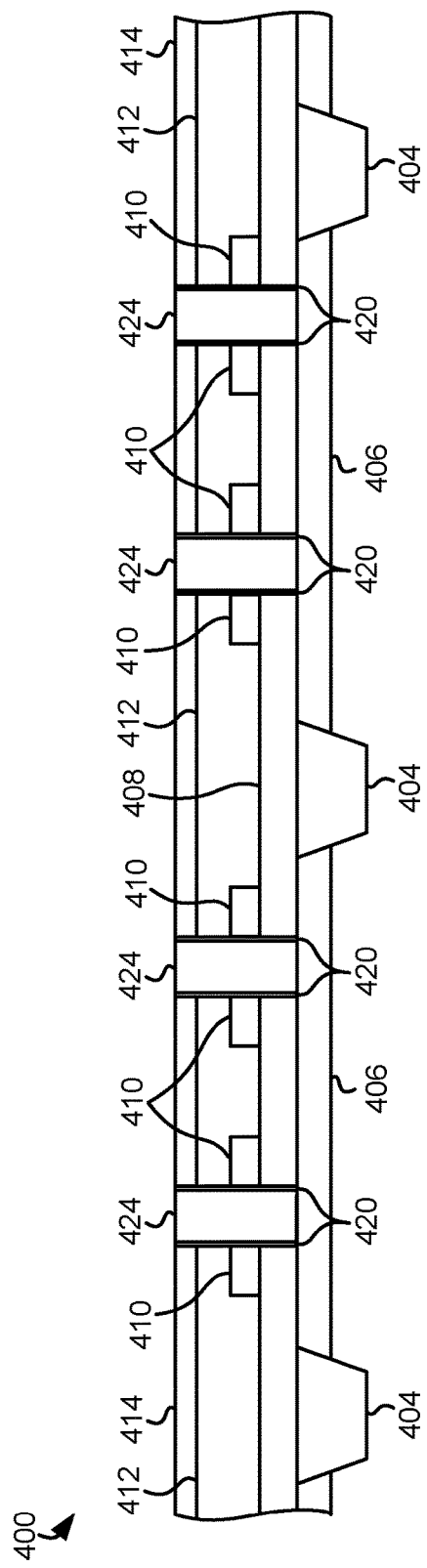

Moving to FIG. 4H, another oxide layer (not shown) is preferably deposited over the resulting structure shown in FIG. 4G. In other words, another oxide layer is preferably deposited over the exposed portions of the vertically grown channels 424 and the exposed portions of the annular cylindrical gate dielectric layer 420. Furthermore, a removal process is performed which may expose the previously underlying nitride layer 414, thereby removing the rounded top-portions of the vertically grown channels 424 seen in FIG. 4G and portions of the gate dielectric layer 420. The removal process may even remove a portion of the nitride layer 414 in some approaches, thereby redefining an upper surface of the resulting structure. However, for each of the transistor structures, portions of the gate dielectric layer 420 remain positioned between the vertically grown channels 424 and each of the respective word lines 410, e.g., as shown. Moreover, the removal process performed may include a chemical-mechanical planarization process in some approaches. However, other types of removal processes may be used depending on the desired approach.

Although not shown in the present embodiment, additional fabrication steps may be performed on the resulting structure illustrated in FIG. 4H. For instance, a p-MTJ sensor structure may be coupled to each of the vertically grown channels 424 in order to form a plurality of memory cells (e.g., see FIGS. 8A-8H below). Accordingly, the resulting structure shown in FIG. 4H may further be used to form a MRAM array according to any of the other approaches described herein.

Looking now to FIGS. 5A-5D, various processes of an exemplary fabrication method 500 for forming a vertical channel transistor is illustrated in accordance with one embodiment. However, it should be noted that several of the fabrication steps included in method 500 may be the same or similar to those described above with respect to method 400. Accordingly, FIGS. 5A-5D are actually shown as beginning with the same structure shown in FIG. 4F above. Moreover, various ones of the layers, structures, material, etc. may be the same or similar as those described above, and therefore FIGS. 5A-5D include common numbering with FIG. 4A-4F.

The method 500 may be performed in accordance with the present invention in any of the environments depicted in FIGS. 1-3B, among others, in various embodiments. Of course, more or less operations than those specifically described in FIGS. 5A-5D may be included in method 500, as would be understood by one of skill in the art upon reading the present descriptions. Moreover, each of the steps of the method 500 may be performed by any suitable component of the operating environment. For example, in various embodiments, the method 500 may be partially or entirely performed by a controller, a processor, etc., or some other device having one or more processors therein which is able to communicate with (e.g., send commands to and/or receive information from) various fabrication components which would be apparent to one skilled in the art after reading the present description.

The processor, e.g., processing circuit(s), chip(s), and/or module(s) implemented in hardware and/or software, and preferably having at least one hardware component may be utilized in any device to perform one or more steps of the method 500. Illustrative processors include, but are not limited to, a central processing unit (CPU), an application specific integrated circuit (ASIC), a field programmable gate array (FPGA), etc., combinations thereof, or any other suitable computing device known in the art. Moreover, it should be noted that the various approaches described in relation to method 500 may be used to form any desired type of complementary metal-oxide-semiconductor CMOS and/or MOS devices.

Figure 5A:
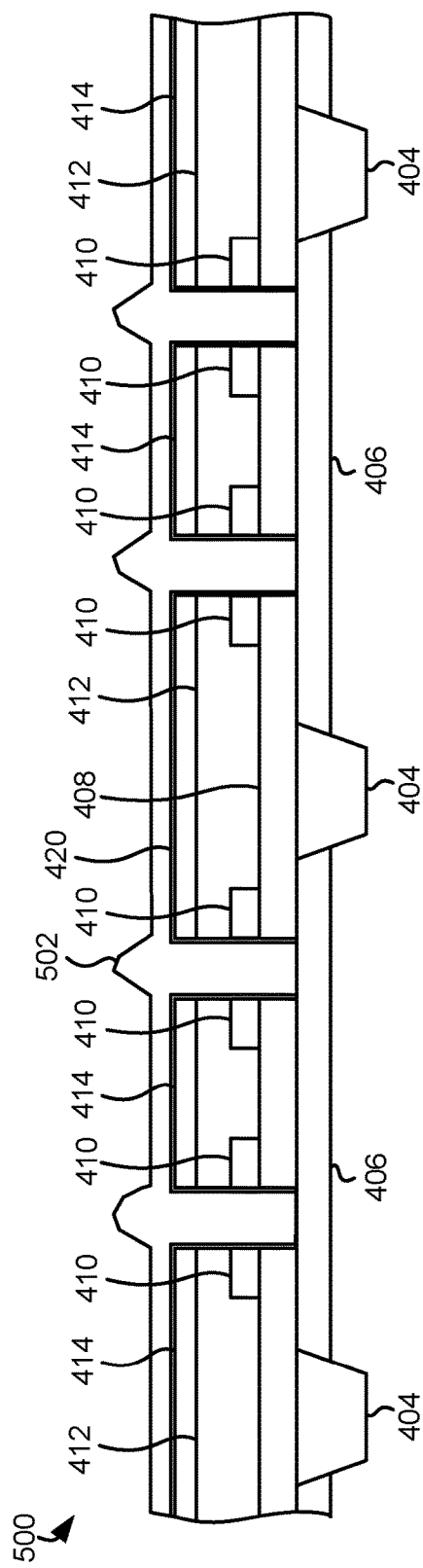

As shown in FIG. 5A, method 500 begins with a similar structure as that illustrated in FIG. 4F above. However, method 500 differs from method 400 in that a silicon material 502 is deposited on the annular cylindrical gate dielectric layer 420 and the doped material 406 in each of the holes. The type of silicon material 502 used may vary depending on the approach. In preferred approaches the silicon material 502 is a nano-crystalline silicon material. The nano-crystalline silicon material is preferably deposited in a low temperature environment in order to achieve more desirable properties of the resulting layer formed. According to the present description, a "low temperature" is a temperature that is at least lower than the temperature of a normal transistor fabrication environment. In some approaches, the low temperature environment may be a refrigerated room, an air-conditioned compartment, etc.

As previously mentioned, it may be desirable in some approaches to perform a cleaning process on the exposed surfaces of the resulting structure prior to depositing the silicon material 502. In other words, a cleaning process may be performed on the annular cylindrical gate dielectric layer 420 and exposed portions of the doped material 406 in each of the holes. The cleaning process may remove any particulates, contaminants, etc. that may have formed on the exposed surfaces of the structure, particularly in the holes 418. As a result, more desirable vertical channels may be achieved. However, it should be noted that in some approaches a cleaning process may not be performed.

Once the silicon material 502 has been deposited, a narrow hole region 504 may be defined above each of the previously defined holes 418. Thus, the number of narrow hole regions 504 may correspond to (e.g., matches) the number of holes 418. Moreover, each of the narrow hole regions 504 is preferably narrower (measured along the deposition plane which is perpendicular to the deposition direction 450) than the previously formed holes 418. According to some approaches, the narrow hole regions 504 may be defined by a mask. In other words, the narrow hole regions 504 may be defined by the voids that are in a mask which is applied to the upper surface of the resulting structure shown in FIG. 5A.

Figure 5B:
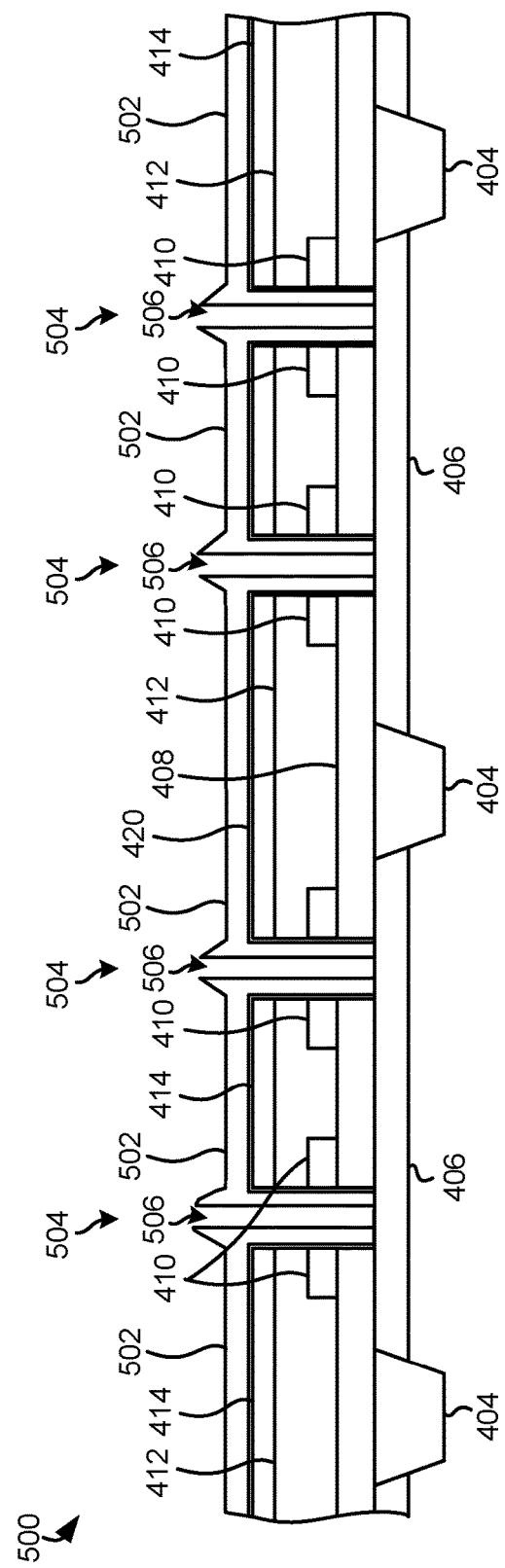

Moving to FIG. 5B, a removal process, e.g., such as an etching process (dry etching process, wet etching process, etc.), may be performed in order to actually form the narrow holes 506 at each of the defined narrow hole regions 504. The removal process is preferably conducted such that the holes 504 formed in the structure shown in FIG. 5B extend through each of the vertical structures of silicon material 502, and down to an upper surface of the doped material 406. However, as mentioned above, each of the narrow hole regions 506 is preferably narrower than the previously formed holes 418. Thus, a portion of the silicon material 502 remains on both sides of the narrow holes 506, e.g., as shown. As alluded to above, creating holes than are smaller (narrower) than the initially formed holes 418 may be performed using a sub-lithographic hole processes, e.g., such as those described with respect to FIGS. 5A-5D. These narrower holes may allow for the resulting structure to experience improved electrostatic gate controllability and/or reduced leakage current associated with nanocrystalline silicon channels, e.g., as would be apparent to one skilled in the art after reading the present description.

Looking now to FIG. 5C, method 500 further includes depositing a dielectric material 508 over the silicon material 502 and the exposed portions of the doped material 406 at the base of each of the narrow holes 506, thereby forming annular cylindrical structures in each of the narrow holes 506. According to some approaches, an oxide may be deposited along with the dielectric material 508, e.g., such as aluminum oxide, silicon oxide, etc. Moreover, the dielectric material 508 may include silicon nitride in some approaches.

Furthermore, FIG. 5D shows the result of filling the remaining portions of the narrow holes with an oxide material 510 and performing a subsequent planarization process on the resulting structure. The planarization process preferably removes at least the raised portions of the silicon material 502 and the dielectric material 508 formed thereover. The planarization process may also remove the portions of the gate dielectric layer 420, thereby exposing an upper surface of the nitride layer 414, e.g., as shown in FIG. 5D. Thus, the planarization process may effectively define the upper surface of the resulting structure. According to an illustrative approach, the planarization process may be a chemical-mechanical planarization process, but may include any other type of desired planarization process.

Although not shown in the present embodiment, additional fabrication steps may be performed on the resulting structure illustrated in FIG. 5D. For instance, a p-MTJ sensor structure may be coupled to each of the vertical structures of silicon material 502 in order to form a plurality of memory cells (e.g., see FIGS. 8A-8H below). Accordingly, the resulting structure shown in FIG. 5D may further be used to form a MRAM array according to any of the other approaches described herein.

Looking now to FIGS. 6A-6B, various processes of an exemplary fabrication method 600 for forming a vertical channel transistor is illustrated in accordance with one embodiment. However, it should be noted that several of the fabrication steps included in method 600 may be the same or similar to those described above with respect to method 400. Accordingly, FIGS. 6A-6B are actually shown as beginning with the same structure shown in FIG. 4F above. Moreover, various ones of the layers, structures, material, etc. may be the same or similar as those described above, and therefore FIGS. 6A-6B include common numbering with FIG. 4A-4F.

The method 600 may be performed in accordance with the present invention in any of the environments depicted in FIGS. 1-3B, among others, in various embodiments. Of course, more or less operations than those specifically described in FIGS. 6A-6B may be included in method 600, as would be understood by one of skill in the art upon reading the present descriptions. Moreover, each of the steps of the method 600 may be performed by any suitable component of the operating environment. For example, in various embodiments, the method 600 may be partially or entirely performed by a controller, a processor, etc., or some other device having one or more processors therein which is able to communicate with (e.g., send commands to and/or receive information from) various fabrication components which would be apparent to one skilled in the art after reading the present description.

The processor, e.g., processing circuit(s), chip(s), and/or module(s) implemented in hardware and/or software, and preferably having at least one hardware component may be utilized in any device to perform one or more steps of the method 600. Illustrative processors include, but are not limited to, a central processing unit (CPU), an application specific integrated circuit (ASIC), a field programmable gate array (FPGA), etc., combinations thereof, or any other suitable computing device known in the art. Moreover, it should be noted that the various approaches described in relation to method 600 may be used to form any desired type of complementary metal-oxide-semiconductor CMOS and/or or MOS devices.

As shown in FIG. 6A, method 600 begins with a similar structure as that illustrated in FIG. 4F above. However, method 600 differs from method 400 in that a silicon material 602 is deposited on the gate dielectric layer 420 and the doped material 406 in each of the holes. The type of silicon material 602 used may vary depending on the approach. In some approaches an amorphous silicon material may be used. In other approaches the silicon material 602 is a nano-crystalline silicon material. The nano-crystalline silicon material is preferably deposited in a low temperature environment in order to achieve more desirable properties of the resulting layer formed. According to the present description, a "low temperature" is a temperature that is at least lower than the temperature of a normal transistor fabrication environment. In some approaches, the low temperature environment may be a refrigerated room, an air-conditioned compartment, etc.

As previously mentioned, it may be desirable in some approaches to perform a cleaning process on the exposed surfaces of the resulting structure prior to depositing the silicon material 602. In other words, a cleaning process may be performed on the gate dielectric layer 420 and exposed portions of the doped material 406 in each of the holes. The cleaning process may remove any particulates, contaminants, etc. that may have formed on the exposed surfaces of the structure, particularly in the holes 418. As a result, more desirable vertical channels may be achieved. However, it should be noted that in some approaches a cleaning process may not be performed.

Once the silicon material 602 has been deposited, a planarization process is performed on the upper surface of the resulting structure seen in FIG. 6A. The planarization process may include performing a chemical-mechanical planarization process in some approaches. Moreover, the planarization process preferably at least exposes the nitride layer 414.

Accordingly, moving to FIG. 6B, the nitride layer 414 is shown as being exposed along the top surface of the resulting structure. Moreover, a laser annealing process is performed on the silicon material 602 deposited above in FIG. 6A. The laser annealing process is a localized process which is preferably directed to the portions of the silicon material 602 located in the holes. Specifically, the laser annealing process may actually facilitate the crystallization of the molecular structure of the silicon material 602, thereby forming a crystallized silicon material 602'. In other words, the laser annealing process has a detectable effect on the physical composition and characteristics of the silicon material 602'. Specifically, the crystallization of the silicon material 602 by effectively utilizing mono-crystalline structure of doped material 406 as a seed layer for recrystallization, thereby desirably improving the performance of the resulting transistor structure and/or the MRAM array in which it is implemented.

Once again, although not shown in the present embodiment, additional fabrication steps may be performed on the resulting structure illustrated in FIG. 6B. For instance, a p-MTJ sensor structure may be coupled to each of the vertical structures of the silicon material 602 in order to form a plurality of memory cells (e.g., see FIGS. 8A-8H below). Accordingly, the resulting structure shown in FIG. 6B may further be used to form a MRAM array according to any of the other approaches described herein.

Looking now to FIGS. 7A-7B, various processes of an exemplary fabrication method 700 for forming a vertical channel transistor is illustrated in accordance with one embodiment. However, it should be noted that several of the fabrication steps included in method 700 may be the same or similar to those described above with respect to method 400.

Accordingly, FIGS. 7A-7B are actually shown as beginning with the same structure shown in FIG. 4F above. Moreover, various ones of the layers, structures, material, etc. may be the same or similar as those described above, and therefore FIGS. 7A-7B include common numbering with FIG. 4A-4F.

The method 700 may be performed in accordance with the present invention in any of the environments depicted in FIGS. 1-3B, among others, in various embodiments. Of course, more or less operations than those specifically described in FIGS. 7A-7B may be included in method 700, as would be understood by one of skill in the art upon reading the present descriptions. Moreover, each of the steps of the method 700 may be performed by any suitable component of the operating environment. For example, in various embodiments, the method 700 may be partially or entirely performed by a controller, a processor, etc., or some other device having one or more processors therein which is able to communicate with (e.g., send commands to and/or receive information from) various fabrication components which would be apparent to one skilled in the art after reading the present description.

The processor, e.g., processing circuit(s), chip(s), and/or module(s) implemented in hardware and/or software, and preferably having at least one hardware component may be utilized in any device to perform one or more steps of the method 700. Illustrative processors include, but are not limited to, a central processing unit (CPU), an application specific integrated circuit (ASIC), a field programmable gate array (FPGA), etc., combinations thereof, or any other suitable computing device known in the art. Moreover, it should be noted that the various approaches described in relation to method 700 may be used to form any desired type of complementary metal-oxide-semiconductor CMOS and/or MOS devices.

As shown in FIG. 7A, method 700 begins with a similar structure as that illustrated in FIG. 4F above. However, method 700 first differs from method 400 in that a stress inducing nitride layer 702 is positioned between the oxide layer 408 and the nitride layer 414. Thus, rather than depositing another oxide layer 412 on the patterned word lines 410 and on the previously deposited oxide layer 408 as seen in FIG. 4C above, a stress inducing nitride layer may be deposited. Having a stress inducing nitride layer 702 between the oxide layer 412 and the nitride layer 414 may desirably result in a transistor structure which is able to pass more current therethrough, e.g., as would be appreciated by one skilled in the art after reading the present description.

Referring still to FIG. 7A, a silicon material 704 (e.g., layer) is deposited on the gate dielectric layer 420 and the doped material 406 in each of the holes. The type of silicon material 704 used may vary depending on the approach. However, in preferred approaches an amorphous silicon material may be used. Moreover, the process of depositing the silicon material 704 may actually be effected by the stress inducing nitride layer 702. In other words, the stress inducing nitride layer may actually change the properties of the silicon material 704 as it is deposited into the holes and/or after the vertical columns of silicon material 704 have been formed on the inner surfaces of the annular cylindrical gate dielectric layer 720 as the stress inducing nitride layer 702. According to some preferred approaches, recrystallization and thermal annealing may be performed on the deposited silicon material and subsequently a tensile stress of the stress inducing nitride layer 702 may be applied to the silicon material.

This phenomenon may be caused by processing steps performed on the nitride layer itself and the subsequent effects the nitride layer 702 has on the remaining layers of the structure. Specifically, in some approaches a deposition condition of the nitride layer 702 may be modified such that the thermal annealing process performed on the silicon material 704 actually causes the nitride layer 702 to exert a pushing force on the structures and/or layers around it in a lateral direction perpendicular to the deposition direction. According to one example, which is in no way intended to limit the invention, once the silicon material 704 is deposited, the stress-induced nitride layer 702 may be locally heated during a recrystallization phase, e.g., as will be described in further detail below. Therefore, the nitride layer 702 may exert a pushing force laterally on surrounding structures which may include the gate dielectric 420, and the silicon material 704 in the vertical channels sandwiched between the nitride layers 702. As a result, the lattice constant of the silicon material 704 is elongated in the vertical direction (the deposition direction). The elongated Silicon lattice constants may be about 5.431 angstroms (Å), but may be smaller or larger depending on the desired approach. These changes in the silicon lattice constant may also change the electronic band structure of the silicon material 704. Moreover, by increasing the silicon lattice constant in the direction electrons are traveling through the vertical channel, the mobility of the electrons is increased because the silicon atoms are spaced further apart in the silicon material 704, and as a result, electrons may travel farther through the silicon material 704 in the vertical channels without scattering. In essence, having stress-inducing silicon material 704 in combination with the stress-inducing silicon material 704 subsequently applying stress (e.g., lateral force) to existing structures (e.g., layers), then the existing structure should feel strain. Moreover, by performing a silicon recrystallization phase during which the silicon material 704 is recrystallized while also experiencing stress and/or strain from the surrounding nitride layer 702, these desirable effects are further solidified.

As previously mentioned, it may be desirable in some approaches to perform a cleaning process on the exposed surfaces of the resulting structure prior to depositing the silicon material 704. In other words, a cleaning process may be performed on the annular cylindrical gate dielectric layer 420 and exposed portions of the doped material 406 in each of the holes. The cleaning process may remove any particulates, contaminants, etc. that may have formed on the exposed surfaces of the structure, particularly in the holes 418. As a result, more desirable vertical channels may be achieved. However, it should be noted that in some approaches a cleaning process may not be performed.

Once the silicon material 704 has been deposited, the silicon material 704 may be annealed. Any type of annealing process which would be apparent to one skilled in the art after reading the present description may be used on the silicon material 704. By annealing the silicon material 704, certain characteristics of the vertical channels that the silicon material 704 forms may be adjusted and improved.

Moreover, after the annealing process is performed on the silicon material 704, it is preferred that the silicon material 704 is recrystallized. It follows that the crystalline molecular structure of the silicon material 704 may be at least somewhat effected (e.g., degraded) as a result of the annealing process. Thus, by recrystallizing the silicon material 704, the resulting transistor structure may retain the improved performance characteristics associated with using an at least partially crystalline silicon material 704 to form the vertical channel thereof. In some approaches, the recrystallization of the silicon material 704 may be performed using a laser. In other approaches, the recrystallization of the silicon material 704 may be thermally induced.

After the silicon material 704 has been deposited, annealed and recrystallized, a planarization process may be performed on the upper surface of the resulting structure seen in FIG. 7A. The planarization process may include performing a chemical-mechanical planarization process in some approaches. Moreover, the planarization process preferably at least exposes the nitride layer 414. Accordingly, moving to FIG. 7B, the nitride layer 414 is shown as being exposed along the top surface of the resulting structure.

Again, although not shown in the present embodiment, additional fabrication steps may be performed on the resulting structure illustrated in FIG. 7B. For instance, a p-MTJ sensor structure may be coupled to each of the vertical structures of the silicon material 704 in order to form a plurality of memory cells (e.g., see FIGS. 8A-8H below). Accordingly, the resulting structure shown in FIG. 7B may further be used to form a MRAM array according to any of the other approaches described herein.

Looking now to FIGS. 8A-8H, various processes of an exemplary fabrication method 800 for forming a vertical channel transistor is illustrated in accordance with one embodiment. The method 800 may be performed in accordance with the present invention in any of the environments depicted in FIGS. 4A-7B, among others, in various embodiments. Of course, more or less operations than those specifically described in FIGS. 8A-8H may be included in method 800, as would be understood by one of skill in the art upon reading the present descriptions.

Each of the steps of the method 800 may be performed by any suitable component of the operating environment. For example, in various embodiments, the method 800 may be partially or entirely performed by a controller, a processor, etc., or some other device having one or more processors therein which is able to communicate with (e.g., send commands to and/or receive information from) various fabrication components which would be apparent to one skilled in the art after reading the present description. The processor, e.g., processing circuit(s), chip(s), and/or module(s) implemented in hardware and/or software, and preferably having at least one hardware component may be utilized in any device to perform one or more steps of the method 800. Illustrative processors include, but are not limited to, a central processing unit (CPU), an application specific integrated circuit (ASIC), a field programmable gate array (FPGA), etc., combinations thereof, or any other suitable computing device known in the art. Moreover, it should be noted that the various approaches described in relation to method 800 may be used to form any desired type of complementary metal-oxide-semiconductor CMOS and/or MOS devices.

As shown in FIG. 8A, method 800 begins with depositing a first doped silicon layer 802 on a substrate (not shown). The substrate may include silicon, e.g., such as crystallized silicon, in some approaches. An un-doped silicon layer 804 is also deposited on the doped silicon layer 802, and a second doped silicon layer 806 is deposited on the un-doped silicon layer 804. Furthermore, an inter layer dielectric layer 808 is also deposited on the second doped silicon layer 806. According to an illustrative approach, each of the foregoing layers 802, 804, 806, 808 may be deposited in a full film fashion.

The first and second silicon layers 802, 806 may be doped with the same or different materials and/or types of materials. For example, both the first and second silicon layers 802, 806 may be doped with n-type materials, but the specific n-type materials used to dope each of the layers 802, 806 respectively, may differ. In another example, the first silicon layer 802 may be doped with an n-type material while the second silicon layer 806 may be doped with a p-type material, or vice versa. In still another example, both the first and second silicon layers 802, 806 may be doped with the same n-type or p-type material(s). The specific materials used to dope the first and/or second silicon layers 802, 806 may vary, e.g., depending on whether it is desired that the resulting transistor is a p-type transistor or an n-type transistor.

Proceeding to FIG. 8B, active regions 810 are defined. According to some approaches, the active regions 810 may be defined by a mask. In other words, the active regions 810 may be defined as being between voids that are in a mask which is applied to the upper surface of the resulting structure formed in FIG. 8A. Thus, a mask (not shown) may be applied to the resulting structure formed in FIG. 8A, and an etching process may be implemented to remove portions of the layers 802, 804, 806, 808 below. The etching process preferably creates a recessed region at the boundary between each of the active regions 810, where the recessed region preferably extends past the first doped silicon layer 802 and into the substrate (not shown). It should be noted that these recessed regions may be STI regions, which are later used to form STI structures that separate (e.g., electrically insulate) each of the active regions 810 from adjacent active regions 810.

A thin oxide layer (not shown) is preferably formed along the exposed surfaces in each of the recessed regions, after which a thin nitride layer (not shown) may also be deposited on the previously deposited thin oxide layer. A thick second oxide layer 812 is also deposited into each of the recessed regions, thereby forming the above mentioned STI structures 814. According to an exemplary approach, the second oxide layer 812 may be deposited and planarized thereafter, e.g., in order to achieve the uniform upper surface of the resulting structure shown in FIG. 8B. According to one approach, the second oxide layer 812 may be planarized using a chemical-mechanical planarization process which defines upper surfaces of the STI structures 814 which are preferably flush with an upper surface of the inter layer dielectric layer 808. Moreover, it should be noted that the second oxide layer 812 is "thick" at least with respect to the "thin" oxide and/or nitride layers. In one example, which is in no way intended to limit the invention, a deposition thickness of each of the respective thin oxide and nitride layers may be about 10% of a deposition thickness of the second oxide layer 812.

Looking now to FIG. 8C, a poly-silicon material 816 is deposited in each of the active regions 810. Although the poly-silicon material 816 is shown in FIG. 8C as being shaped in several different distinct structures along the upper surface of the inter layer dielectric layer 808, the poly-silicon material 816 may originally be deposited full film at least in each of the active regions 810, and patterned thereafter to form the unique word lines 818 seen in FIG. 8C.

Once the word lines 818 have been patterned, an oxide layer 820 is deposited on the inter layer dielectric layer 808, the word lines 818, and exposed portions of the STI structures 814. Moreover, a nitride layer 822 is deposited on the oxide layer 820, e.g., as shown. The nitride layer 822 may be planarized after it is formed, e.g., such that a uniform, smooth upper surface of the nitride layer 822 is formed. Any desired type of planarization process(es) may be implemented to condition an upper surface of the nitride layer 822 depending on the approach.

Moving to FIG. 8D, hole regions 824 may be defined above each of the previously defined word lines 818. Thus, the number of hole regions 824 defined preferably corresponds to the number of defined word lines 818 therebelow. According to some approaches, the hole regions 824 may be defined by a mask. In other words, the hole regions 824 may be defined by the voids that are in a mask which is applied to the upper surface of the resulting structure shown in FIG. 8C.

A removal process, e.g., such as an etching process (dry etching process, wet etching process, etc.), may be performed in order to actually form the holes at each of the defined hole regions 824. The removal process is preferably conducted such that the holes 826 formed in the structure shown in FIG. 8D extend through a central portion of each of the respective word lines 818, and down to an upper surface of the second doped silicon layer 806. Holes 826 which intersect a center region of each of the respective word lines 818 thereby form word lines 818 which encircle a middle portion of a respective hole 826 (which will later be used to form the vertical cylinder structure) as a result of the removal process.

A gate dielectric layer 828 is deposited on the nitride layer 822 and on the exposed surfaces in the holes 826. As a result, the portions of the gate dielectric layer 828 deposited onto the exposed inner surfaces of the holes 826 have an annular cylindrical shape. Furthermore, a protective layer 830 is deposited on the gate dielectric layer 828. The gate dielectric layer 828 may include any type of gate dielectric material which would be apparent to one skilled in the art after reading the present description. Moreover, the protective layer 830 is preferably deposited to protect the gate dielectric layer 420 during subsequent fabrication processes, e.g., as will soon become apparent.

Figure 8E:
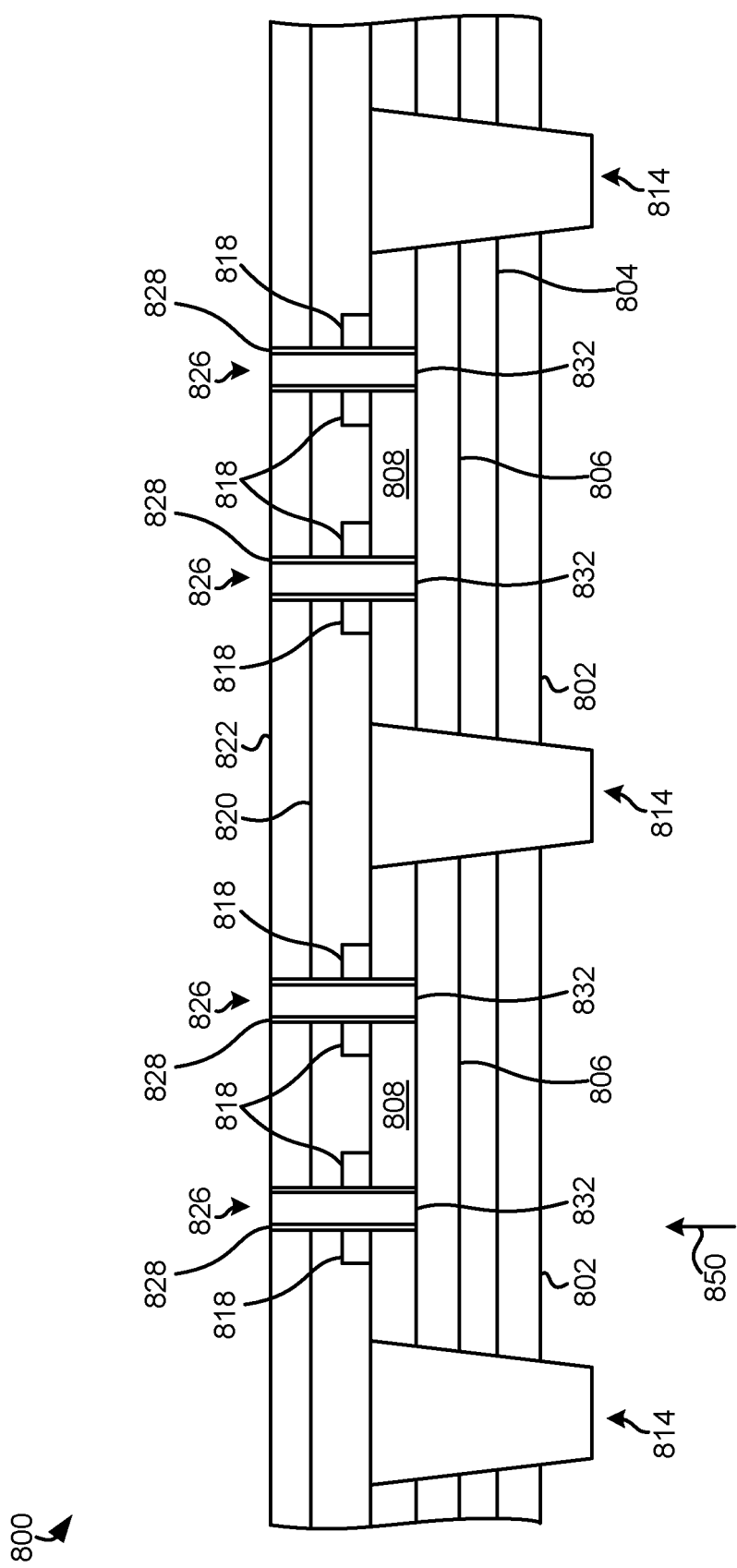

Moving to FIG. 8E, an etching process may be performed at least in each of the holes 826. Accordingly, the second doped silicon layer 806 at the base of each of the holes 826 is preferably exposed as a result of the etching process performed therein. However, a remainder of the annular cylindrical gate dielectric layer 828 remains intact, e.g., because of the protective layer 830. Once the etching process has concluded, any remaining portions of the protective layer 830 are selectively removed, thereby exposing the remaining portions of the gate dielectric layer 828 along the vertical sides of the holes 826 and above the nitride layer 822. It follows that the protective layer 830 may include materials which are resistant to etching processes or similar removal processes, or which will at act in a sacrificial manner to protect the underlying gate dielectric layer 828. As a result, the desirable material characteristics of the gate dielectric layer 828 may be conserved by the protective layer 830, despite the fact that an etching process is performed. For example, the gate dielectric layer 828 may have characteristics which are protected by the protective layer 830, and later used to induce a uniform crystalline structure growth thereover. According to an exemplary approach, remaining portions of the protective layer 830 may be selectively removed by using a solution that only reacts with the protective layer 830.

A cleaning process is also preferably performed on the exposed surfaces of the resulting structure shown in FIG. 8E. In other words, a cleaning process is also preferably performed on the gate dielectric layer 828 and exposed portions of the second doped silicon layer 806 in each of the holes 826. The cleaning process may remove any particulates, contaminants, etc. that may have formed on the exposed surfaces of the structure, particularly in the holes 826. As a result, more desirable vertical channel growth may be achieved. However, it should be noted that in some approaches a cleaning process may not be performed.

Referring still to FIG. 8E, vertical channels 832 are formed in each of the holes 826. The vertical channels 832 preferably include silicon which is actually grown vertically along the deposition direction 850 in each of the holes 826 rather than being deposited therein. According to a specific approach, the vertical channels 832 may be formed by inducing epitaxial growth of the silicon from the second doped silicon layer 806 at the base of each of the holes 826. The epitaxial silicon growth may be induced using nitrogen sidewall passivation of each of the holes 826, e.g., as would be appreciated by one skilled in the art after reading the present description. Moreover, the vertical channels 832 shown in FIG. 8E have already been planarized, the vertical channels 832 preferably grow (e.g., extend) past an upper surface of the nitride layer 822 as well as exposed upper surfaces of the gate dielectric layer 828, e.g., as seen in FIG. 4G above. Accordingly, any of the approaches described above with respect to FIGS. 4G-4H may be implemented in combination with FIGS. 8D-8E to achieve the resulting structure illustrated in FIG. 8E. As a result, each of the annular cylindrical gate dielectric layers 828 are positioned between a respective vertical channel 832 and corresponding word line 818.

Figure 8F:
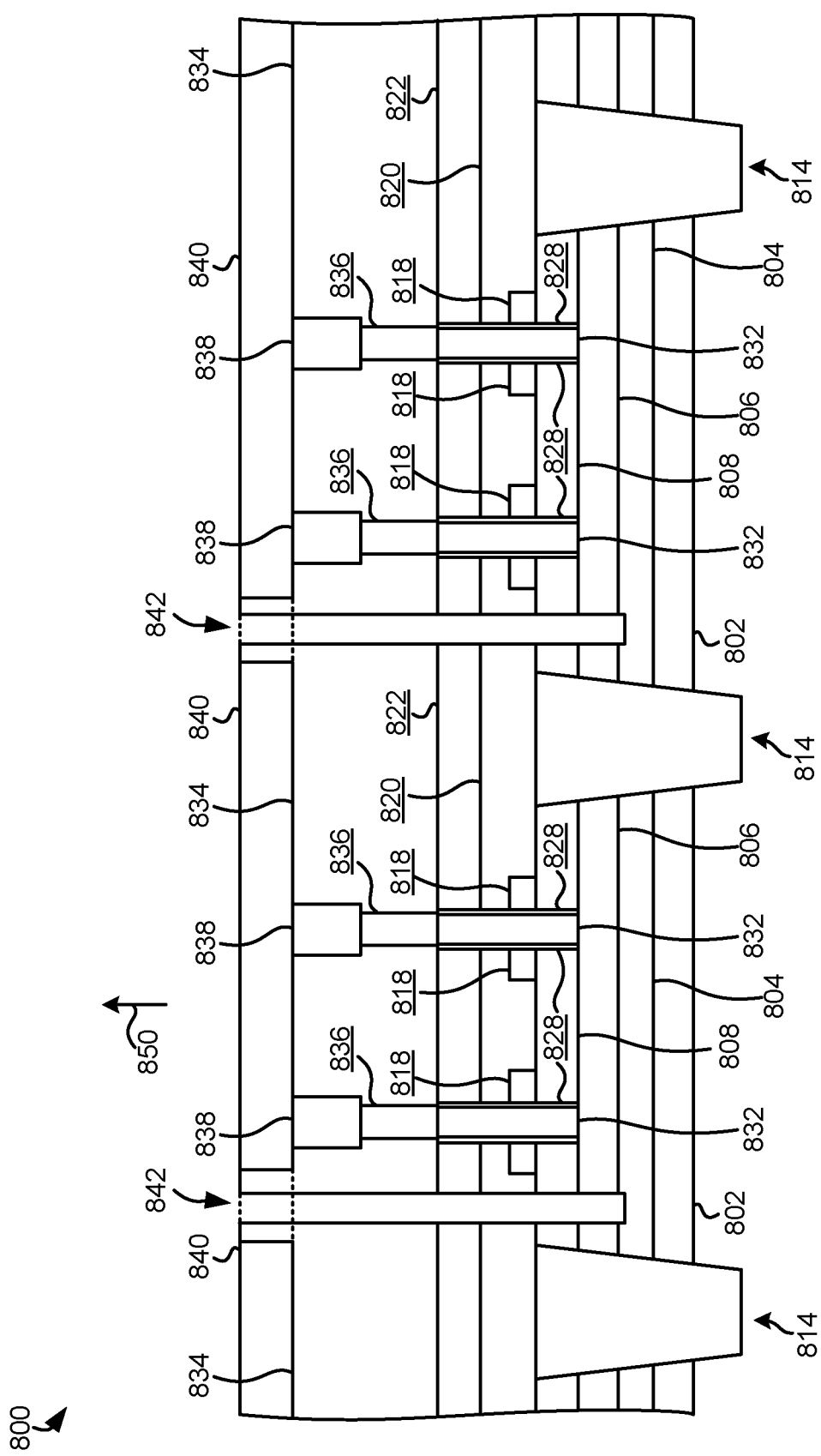

Looking now to FIG. 8F, method 800 further includes depositing a thick oxide layer 834 on (e.g., over) the nitride layer 822, the upper surface of the vertical channels 832, and the exposed portions of the gate dielectric layer 828. Moreover, an etching process is performed to create a recessed area which extends through the thick oxide layer 834 down to the upper (e.g., top) surface of each of the vertical channels 832 formed with vertically grown epitaxial silicon material as described above.

Furthermore, a p-MTJ sensor structure 836 is formed in each of the recessed areas which extend through the thick oxide layer 834. In other words, a p-MTJ sensor structure 836 is formed on each of the epitaxial silicon structures 832 such that a bottom layer of the p-MTJ sensor structure 836 is electrically coupled to the upper surface of the epitaxial silicon structures 832. Any desired processes which would be apparent to one skilled in the art after reading the present description may be used to form (e.g., construct) the p-MTJ sensor structures 836, e.g., depending on the approach. Moreover, although the individual layers included in each of the p-MTJ sensor structure 836 are not shown in the present embodiment, it should be noted that the p-MTJ sensor structures 836 may include any of the layers, materials, characteristics, etc. described in the various approaches corresponding to the MTJ memory element 100 of FIG. 1 and/or p-MTJ sensor stack 202 of FIG. 2 above.

With continued reference to FIG. 8F, an extension region 838 is preferably formed on each of the p-MTJ sensor structures 836. Each of the extension regions 838 are electrically coupled to a top-most layer of a respective one of the p-MTJ sensor structures 836. Accordingly, the extension regions 838 each preferably include one or more desired electrically conductive materials (e.g., metallic materials). However, it is also preferred that the material(s) used in each of the extension region 838 is non-magnetic, e.g., so as to not interfere with the successful operation of the p-MTJ sensor structures 836 coupled thereto. As described above, the p-MTJ sensor structures 836 are able to store a bit of data (e.g., a logical "1" or a logical "0") by selectively setting the magnetic direction of a free layer included therein. Thus, the free layer in each of the p-MTJ sensor structures 836 is preferably insulated from any exterior (e.g., foreign) magnetic fields so the magnetic orientation of the free layer is not unintentionally (and unknowingly) flipped, thereby overwriting the bit of information stored therein, e.g., as would be appreciated by one skilled in the art after reading the present description.

As shown, the extension regions 838 preferably extend up to an upper surface of the thick oxide layer 834. Moreover, a common bit line 840 is formed along the upper surface of the thick oxide layer 834, and thereby is preferably electrically coupled to each of the extension regions 838, and thereby each of the p-MTJ sensor structures 836 as well. It should be noted that although it appears that the bit lines 840 are only oriented between respective pairs of the STI structures 814, the bit lines 840 actually jog out of the plane of view (e.g., see dashed lines) such that recesses 842 may be formed between each of the STI structures 814 without compromising the continuous common bit line 840. As a result, a common bit line 840 may apply a voltage to each of the extension regions 838. The voltage is in turn applied to each of the corresponding p-MTJ sensor structures 836. However, whether or not a current is actually passed through each of a given p-MTJ sensor structures 836 depends on whether the corresponding transistor structure coupled to the bottom layer of the p-MTJ sensor structures 836 by the vertical channels 832 is activated. It follows that each vertical channel 832 and p-MTJ sensor structures 836 pair forms an effective cell of memory (e.g., see 301 in FIGS. 3A-3B above).

However, each cell is also preferably coupled to a common source line, e.g., as described in correspondence with 3A-3B above, such that a transistor in a specific cell of memory may be activated or deactivated at will. Accordingly, an etching process is also performed to create a recess 842 at portions of the bit line 840 which jog out of the plane of view as represented by the dashed lines in FIG. 8F. This allows for source lines to be formed between each pair of STI structures 814 without causing the bit line 840 to become disjointed, e.g., as described above. Moreover, this also allows for both the bit line 840 and the recesses 842 (which will eventually be used to form common source lines 848 below) to avoid coming in contact with each other, thereby avoiding any electrical shorts from occurring therebetween, e.g. as would be appreciated by one skilled in the art after reading the present description. As shown, the recesses 842 extend down into the un-doped silicon layer 804. Moreover, a recess 842 may be formed between each pair of STI structures 814 which will allow for a common source line to be formed for each "row" of the vertical channel 832 and p-MTJ sensor structures 836 pairs positioned between a same pair of STI structures 814.

Figure 8G:
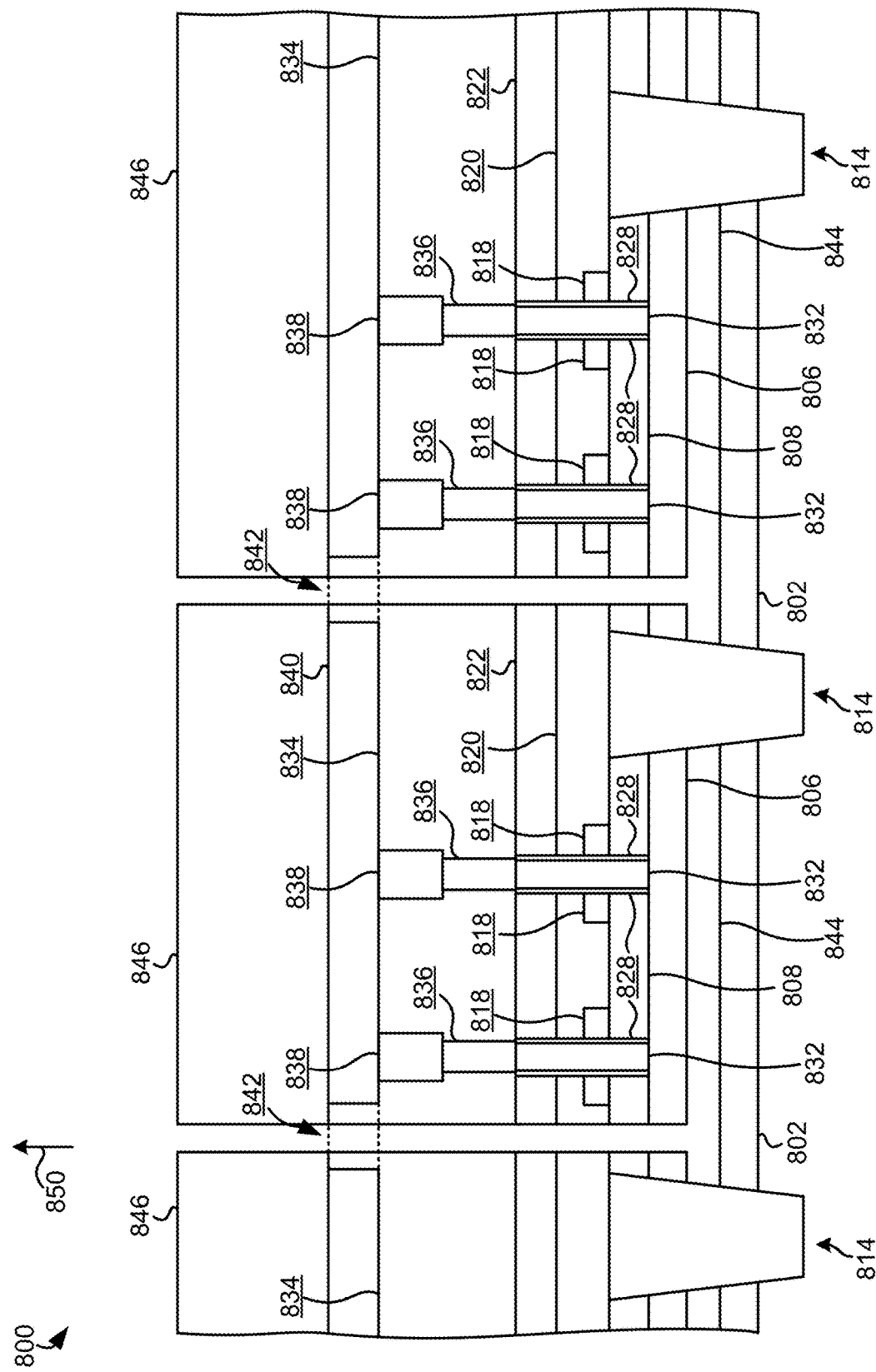

Looking now to FIG. 8G, another thick oxide layer 846 is formed on the uppermost surface of the resulting structure shown in FIG. 8F above. This oxide layer 846 is formed in order to insulate the common bit lines 840 from the common source line contact tabs which are to be formed above each of the voids 844, e.g., as will soon become apparent.

Once the thick oxide layer 846 has been formed, each of the un-doped silicon layers 804 are selectively removed such that a void 844 is created between the first and second doped silicon layers 802, 806. The un-doped silicon layers 804 is preferably selectively removed in such a way that does not affect the integrity (e.g., performance) of the first and second doped silicon layers 802, 806. Thus, a chemical compound which selectively reacts with the un-doped silicon layers 804 may be used. The specific chemical compound may vary depending on the material(s) included in the un-doped silicon layers 804, as well as the material(s) in both of the first and second doped silicon layers 802, 806.

Figure 8H:
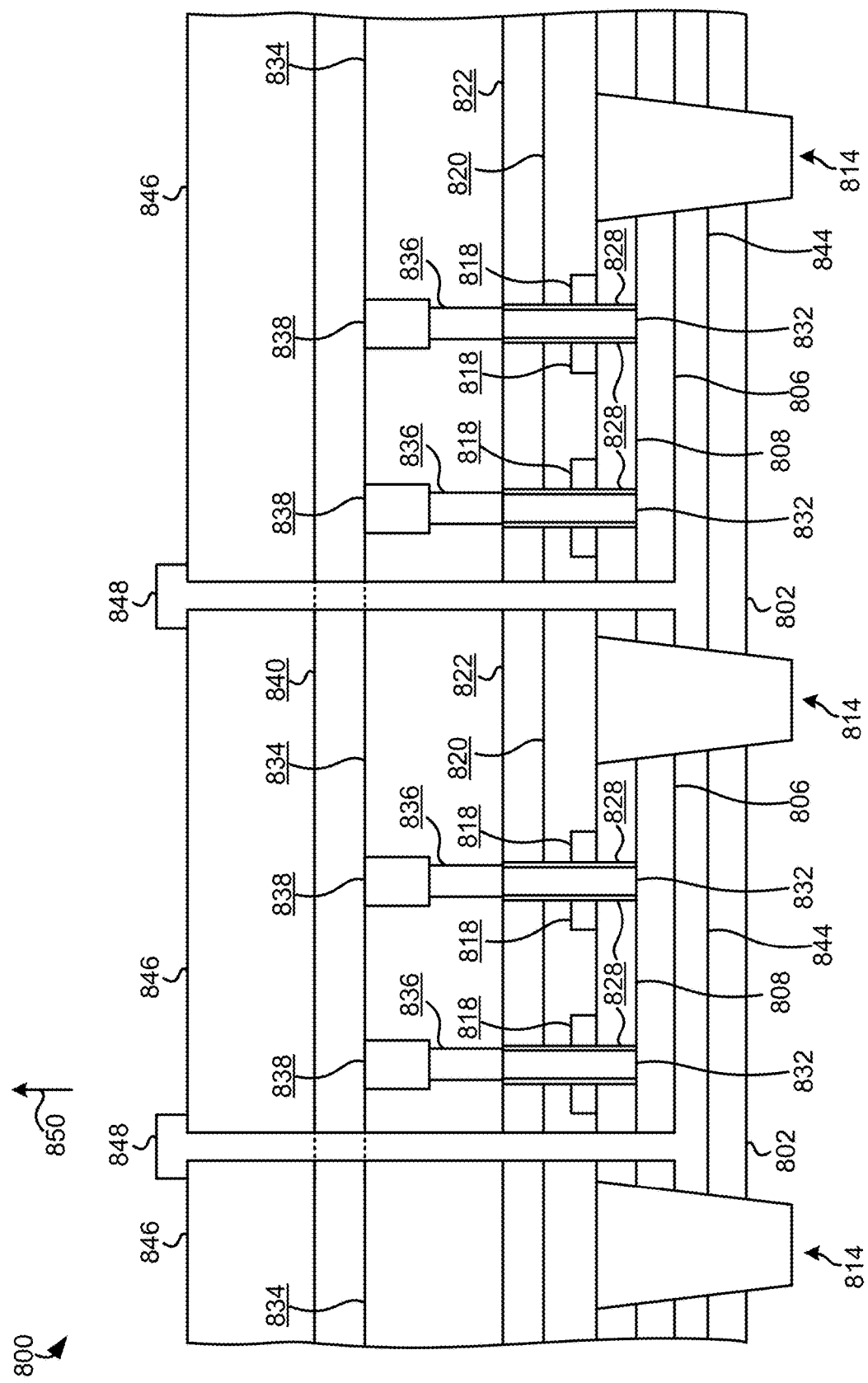

Looking to FIG. 8H, an electrically conductive (and preferably non-magnetic) material is deposited into each of the etched holes 842, extending down into the voids 844 between the first and second doped silicon layers 802, 806. The electrically conductive material is preferably deposited into each of the etched holes 842 such that it fills all empty spaces in both the voids 844 as well as the etched holes. As a result, a common source line 848 is formed for each of the "rows" of transistors positioned between the same pair of STI structures 814. Forming the common source line 848 by selectively removing the un-doped silicon layers 804 allows for the resulting common source line 848 to have reduced parasitic resistances associated therewith while also allowing for a laterally elongated common source line 848.

Depending on the approach, the material used to form the first and/or second doped silicon layers 802, 806 may be an n+ doped material and/or a p+ doped material, e.g., depending on the desired type of resulting transistor structure. For example, the material used to form the second doped silicon layer 806 may be an n+ doped material in order to form an n-type transistor. In another example, the material used to form the second doped silicon layer 806 may be a p+ doped material in order to form a p-type transistor. Moreover, the common source line 848 is electrically coupled to a bottom end of each of the vertical channels 832 through the second doped silicon layer 806 positioned between the same pair of STI structures 814. As a result, voltages may thereby be applied to the vertical channels 832 of the transistors between a common pair of STI structures 814 by applying the voltage to a respective one of the common source lines 848 which is thereby transferred to a bottom of the vertical channels 832 through the second doped silicon layer 806. Moreover, by applying a voltage to a bottom portion of the vertical channels 832 coupled to the same common source line 848, and selectively applying a second voltage to a top portion of the vertical channels 832 by activating only certain ones of the transistor structures, an upper portion of the vertical channels 832 may become a source terminal while a bottom portion of the vertical channels 832 may become a drain terminal or vice versa depending on the voltages applied to the top and bottom portions of the vertical channels 832 respectively, e.g., as would be appreciated by one skilled in the art after reading the present description. As a result, a central portion of the vertical channels 832 may act as a switchable channel of the transistor structure which may be either conductive or not conductive depending on a voltage applied to the word lines 818. In other words, the transistor structures behave like a voltage-controlled switch between the source and drain terminals.

As a result, the selective writing to certain MRAM cells described above may be achieved for embodiments having vertical channel structures as well as shared source lines, e.g., according to any of the approaches described herein. This combination, when implemented in memory arrays, significantly improves memory performance in addition to increasing data storage density in comparison to what has been achievable for conventional products.

It should also be noted that although various ones of the approaches included herein are illustrated as only including two transistor structures between each respective pair if STI structures, any one or more of the approaches described herein may be used to form any desired number of transistor structures and/or p-MTJ sensor stacks (e.g., cells of memory) which are coupled to a same common source line. For instance, any one or more of the fabrication processes included in FIGS. 4A-8H may be used to form two transistor structures, four transistor structures, eight transistor structures, sixteen transistor structures, thirty two transistor structures, sixty four transistor structures, etc., which are positioned between a same pair of STI regions, e.g., depending on the desired approach as would be apparent to one skilled in the art after reading the present description.

Figure 9:
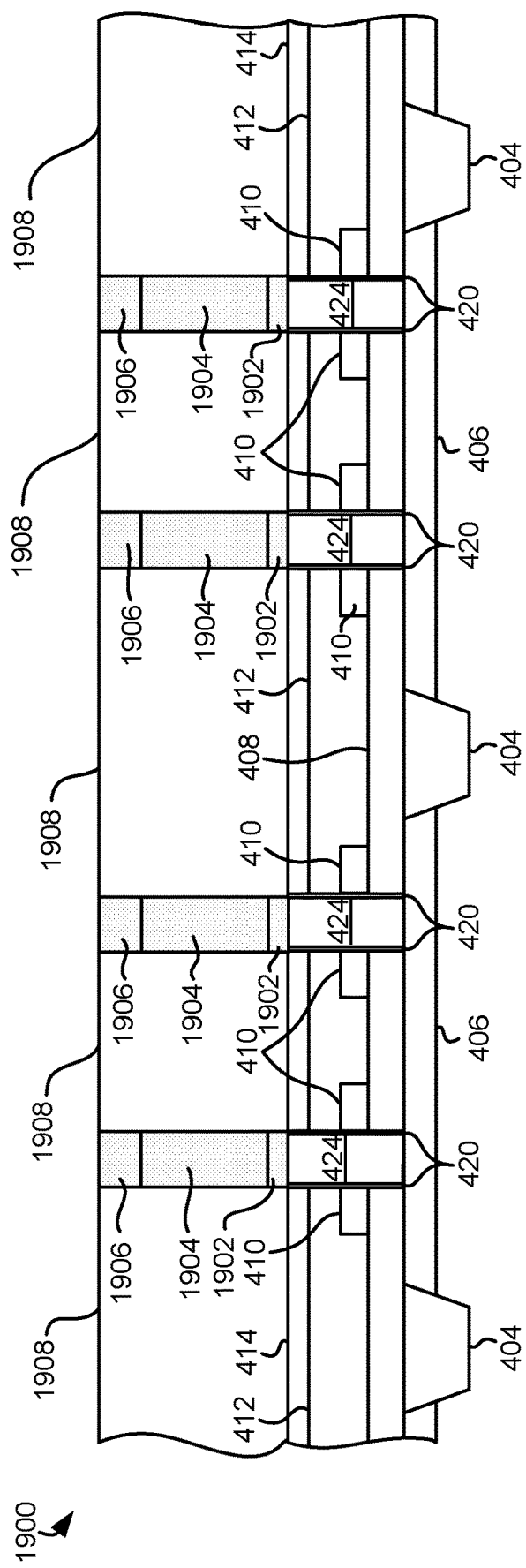
FIG. 9 is a partial perspective view of a vertical channel transistor structure incorporating a magnetic memory element structure.
Figure 10:
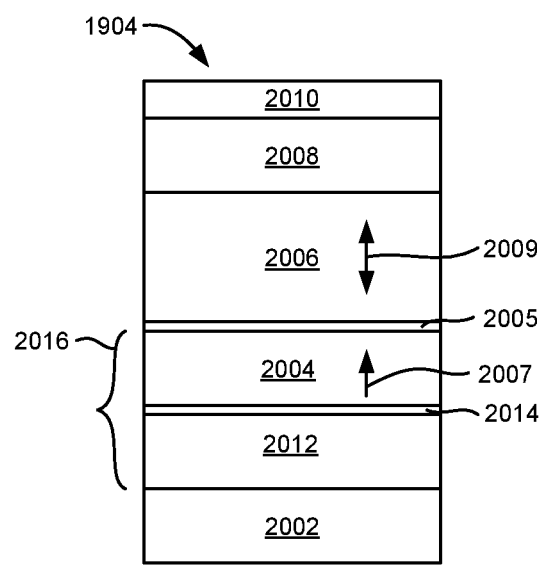
FIG. 10 is a side, cross-sectional, schematic view of a perpendicular magnetic tunnel junction p-MTJ memory element according to an embodiment.

As described above, after formation of one or more transistor structures, one or more magnetic memory elements can be formed over and electrically connected with the one or more transistor structures. FIGS. 9 and 10 illustrate an example of a magnetic memory element such as a perpendicular magnetic tunnel junction (p-MTJ) incorporated with a semiconductor transistor structure according to a possible embodiment. FIG. 9, shows a structure that is built upon a structure such as that described above with reference to FIG. 4H, however it should be understood that this is by way of example and a similar incorporation of a magnetic memory element could also be applied to any of the other structures disclosed above, such as with reference to FIG. 5D, 6B, 7B, or 8H (wherein the memory element corresponds to element 836).

FIG. 9 includes a memory element 1904 that is electrically connected with semiconductor channel 424. An electrically conductive electrode 1902 may be provided between the memory element 1904 and the transistor channel 424 to provide good electrical connection between the memory element 1904 and the semiconductor channel 424. A dielectric isolation material 1908 can be provided between the memory elements 1904 to provide electrical isolation between adjacent memory elements 1904. The memory element 1904 can be a perpendicular magnetic tunnel junction element (p-MTJ) and can be electrically connected with a drain region of the transistor channel 424 via the lower electrode 1902. As discussed above, the memory element 1904 can be incorporated with various of the structures described above such as with regard to FIG. 5D, 6B, 7B or 8H. such as incorporated in the structure described above with regard to FIG. 8H, the memory element 1904 corresponds to element 836 of FIG. 8H.

The opposite or upper end of the memory element 1906 can be electrically connected with an electrically conductive line such as a "bit-line" 1906. In one embodiment, the bit-line 1906 can be configured such that it extends into and out of the plain of the page in FIG. 9. The electrode 1902 and bit line 1906 are each preferably constructed of a non-magnetic, electrically conductive material such as Cu so as not to negatively effect the operation of the memory element 1904. When the transistor channel 424 is switched to an "on" state, a write current can be applied through the memory element 1904 in order to switch the magnetic state of the memory element 1904 to either a high resistance state or a low resistance state in order to record a bit of data to the memory element 1904. The unique design of the transistor channel structure 424, as described above with regard to various embodiments and methods of manufacture, allows a sufficiently high write current to be applied to the memory element 1904 to allow reliable, effective switching of the memory element 1904.

FIG. 10 is a side, cross-sectional schematic illustration of a possible embodiment of a magnetic memory element, such as the magnetic memory element 1904 described above. The memory element 1904 can be a perpendicular magnetic tunnel junction p-MTJ element having a magnetic reference layer 2004 a magnetic free layer 2006 and a non-magnetic barrier layer 2005 disposed between the reference layer 2004 and the magnetic free layer 2006. The magnet reference layer 2004 has a magnetization that is pinned in a direction perpendicular to the plane of the layers as indicated by arrow 2007, whereas the magnetic free layer has a magnetization that can flip between two directions that are perpendicular to the plane of the layers as indicated by arrow 2009. As discussed above, such as with regard to FIG. 1, when the magnetizations 2007, 2009 of the magnetic reference layer 2004 and magnetic free layer 2006 are in the same direction, the memory element 1904 is in a low electrical resistance state, and when the magnetizations 2007, 2009 are in opposite directions, the memory element 1904 is in a high electrical resistance state.

The reference layer 2004 can be part of a synthetic antiferromagnetic (SAF) structure 2016 that can include a magnetic keeper layer 2012 and a non-magnetic antiparallel coupling layer 2014 sandwiched between the reference layer 2004 and the magnetic keeper layer 2012. The SAF structure can help to maintain the pinning of the magnetization of the magnetic reference layer 2004. The use of the SAF structure 2016 provides high coercive field (>1000 Oe) and also results in a very small fringing field (<100 Oe). This small fringing field is beneficial in balancing the switching current, endurance, and retention behavior between antiparallel to parallel magnetic orientations.

One parameter that can affect the performance of a p-MTJ magnetic memory element is the perpendicular magnetic anisotropy of the magnetic reference layer and the magnetic free layer. In the memory element 1904, a high perpendicular magnetic anisotropy in the magnetic free layer 2006 can ensure that the magnetization 2009 remains oriented in one of the two allowed vertical directions, thereby a data bit has been recorded without ambiguity. Similarly, a high perpendicular magnetic anisotropy in the reference layer 2004 helps to ensure that the pinned magnetization 2007 remains pinned in the desired orientation perpendicular to the plane of the reference layer 2004. One way in which to maintain a desired perpendicular magnetic anisotropy in the magnetic free layer 2006 and the magnetic reference layer 2004 is through the selection of materials of the magnetic free layer 2006 and reference layer 2004 and their surrounding layers.

With continued reference to FIG. 10, the magnetic reference layer 2004 can be constructed of one or more of CoFeB, CoFe, CoFeNi, FeNi, FeB, or their alloys. The reference layer could also be constructed of Co/(Pt, Pd) multi-layers or one or more Heusler alloys such as: CoMnSi, CoMnGe, CoMnAl, CoMnFeSi, CoFeSi, CoFeAl, CoCrFeAl or CoFeAlSi. The reference layer 2004 can have a thickness of 1-20 nm, or more preferably 1-10 nm, or even more preferably 1-5 nm. Similarly, the magnetic free layer 2006 can be constructed of one or more of CoFeB, CoFe, CoFeNi, FeNi, FeB, or their alloys. The magnetic free layer 2006 could also be constructed of Co/(Pt, Pd) multi-layers or one or more Heusler alloys such as: CoMnSi, CoMnGe, CoMnAl, CoMnFeSi, CoFeSi, CoFeAl, CoCrFeAl or CoFeAlSi. The magnetic free layer 2006 can have a thickness of 1-10 nm, or more preferably 1-5 nm. The barrier layer 2005 can be constructed of a non-magnetic, electrically insulating material such as one or more of MgO, SiOx or AlOx. The barrier layer 2005 is preferably constructed of magnesium oxide (MgO), which may be deposited by sputter deposition, from either a MgO target or a sintered metal Mg target with natural oxidation. The thickness of the barrier layer 2005 depends on the target resistance, and can be in the range of 0.2 to 2 nm.

As discussed above, the perpendicular magnetic anisotropy of the magnetic free layer 2006 and magnetic reference layer 2004 are affected by the material or materials making up these layers 2004, 2006. In addition, it has been found that the material composition of surrounding layers can also affect the perpendicular magnetic anisotropy of these layers 2004, 2006. With continued reference to FIG. 10, a novel cap layer 2008 is formed directly over, and preferably in contact with, the magnetic free layer 2006. This cap layer 2008 is formed of a material that has been found to increase perpendicular magnetic anisotropy of the magnetic free layer 2006, especially when the magnetic free layer 2006 is sandwiched between this novel cap layer 2008 and the MgO barrier layer 2005. The novel cap layer 2008 can be formed of one or more of Ta, Cr, W, V, Pt, Ru, Pd, Cu, Ag, Rh or alloys thereof. This cap layer can have a thickness of 1 to 10 nm and more preferably has a thickness of about 5 nm. An additional cap layer 2010 such as Ta and Ru can also be provided to provide additional protection of the underlying layers during manufacture.

With continued reference to a novel buffer layer 2002 is formed below the magnetic reference layer 2004. The buffer layer 2002 is constructed of a material that is chosen to enhance the perpendicular magnetic anisotropy of the magnetic reference layer 2004. Similar to the cap layer 2008, the buffer layer 2002 can be constructed of Ta, Cr, W, V, Mo, Pt, Ru, Pd, Cu, Ag, Rh. In one embodiment, the buffer layer 2002 can have a thickness of 1-10 nm or more preferably 1-5 nm. The buffer layer 2002 acts as a PMA enhancer in that it increases the perpendicular magnetic anisotropy (PMA) of the magnetic reference layer 2004. This increase in PMA of the magnetic reference layer improves performance of the magnetic data recording element 1904 by ensuring that the magnetization 2007 of the magnetic reference layer remains fixed in the desired direction perpendicular the plane of the magnetic reference layer as shown in FIG. 10.

It should further be noted that "upper", "top", "above", etc. as used herein with reference to the various fabrication processes described are intended to be with respect to the deposition direction, e.g., as would be appreciated by one skilled in the art after reading the present description.

The description herein is presented to enable any person skilled in the art to make and use the invention and is provided in the context of particular applications of the invention and their requirements. Various modifications to the disclosed embodiments will be readily apparent to those skilled in the art and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

In particular, various embodiments of the invention discussed herein are implemented using the Internet as a means of communicating among a plurality of computer systems. One skilled in the art will recognize that the present invention is not limited to the use of the Internet as a communication medium and that alternative methods of the invention may accommodate the use of a private intranet, a Local Area Network (LAN), a Wide Area Network (WAN) or other means of communication. In addition, various combinations of wired, wireless (e.g., radio frequency) and optical communication links may be utilized.

The program environment in which one embodiment of the invention may be executed illustratively incorporates one or more general-purpose computers or special-purpose devices such hand-held computers. Details of such devices (e.g., processor, memory, data storage, input and output devices) are well known and are omitted for the sake of clarity.

It should also be understood that the techniques of the present invention might be implemented using a variety of technologies. For example, the methods described herein may be implemented in software running on a computer system, or implemented in hardware utilizing one or more processors and logic (hardware and/or software) for performing operations of the method, application specific integrated circuits, programmable logic devices such as Field Programmable Gate Arrays (FPGAs), and/or various combinations thereof. In one illustrative approach, methods described herein may be implemented by a series of computer-executable instructions residing on a storage medium such as a physical (e.g., non-transitory) computer-readable medium. In addition, although specific embodiments of the invention may employ object-oriented software programming concepts, the invention is not so limited and is easily adapted to employ other forms of directing the operation of a computer.

The invention can also be provided in the form of a computer program product which includes a computer readable storage or signal medium having computer code thereon, which may be executed by a computing device (e.g., a processor) and/or system. A computer readable storage medium can include any medium capable of storing computer code thereon for use by a computing device or system, including optical media such as read only and writeable CD and DVD, magnetic memory or medium (e.g., hard disk drive, tape), semiconductor memory (e.g., FLASH memory and other portable memory cards, etc.), firmware encoded in a chip, etc.

A computer readable signal medium is one that does not fit within the aforementioned storage medium class. For example, illustrative computer readable signal media communicate or otherwise transfer transitory signals within a system, between systems e.g., via a physical or virtual network, etc.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof.

In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A magnetic memory array comprising:
   a cylindrical semiconductor channel structure having a first end, a second end opposite the first end and an outer side extending from the first end to the second end;
   an electrically conductive word line surrounding at least a portion of the side of the semiconductor channel structure;
   a gate dielectric layer disposed between the electrically conductive word line and the semiconductor channel structure; and
   a magnetic memory element, electrically connected with first end of the semiconductor channel structure, the magnetic memory element being a perpendicular magnetic tunnel junction element that further comprises:
   a magnetic reference layer;
   a magnetic free layer; and
   a non-magnetic barrier layer disposed between the magnetic reference layer and the magnetic free layer; and
   a perpendicular magnetic anisotropy enhancement layer, comprising one or more of: Ta, Cr, W, V, Mo, Pt, Ru, Pd, Cu, Ag, Ru or alloys thereof disposed directly on the magnetic free layer.

2. The magnetic memory array as in claim 1, wherein the magnetic anisotropy enhancement layer is a buffer layer formed beneath the magnetic reference layer, the buffer layer further comprising one or more of: Ta, Cr, W, V, Mo, Pt, Ru, Pd, Cu, Ag, Ru or alloys thereof.

3. The magnetic memory array as in claim 1, wherein the magnetic anisotropy enhancement layer is a cap layer formed over and contacting the magnetic free layer, the cap layer comprising one or more of: Ta, Cr, W, V, Mo, Pt, Ru, Pd, Cu, Ag, Ru or alloys thereof.

4. The magnetic memory element as in claim 1, wherein the magnetic anisotropy enhancement layer is a buffer layer formed beneath the reference layer, the buffer layer comprising one or more of: Ta, Cr, W, V, Mo, Pt, Ru, Pd, Cu, Ag, Ru or alloys thereof; and further comprising a second magnetic anisotropy enhancement layer that is a cap layer formed over and in contact with the magnetic free layer, the cap layer further comprising one or more of: Ta, Cr, W, V, Mo, Pt, Ru, Pd, Cu, Ag, Ru or alloys thereof.

5. The magnetic memory element as in claim 1, wherein the barrier layer comprises magnesium oxide and wherein the magnetic free layer is sandwiched between the barrier layer and the perpendicular magnetic anisotropy enhancement layer.

6. The magnetic memory array as in claim 1, wherein the barrier layer comprises magnesium oxide and wherein the magnetic reference layer is located between the barrier layer and the perpendicular magnetic anisotropy enhancement layer.

7. The magnetic memory array as in claim 1, wherein:
   the barrier layer comprises magnesium oxide;
   the magnetic free layer is sandwiched between the buffer layer and a cap layer that comprises one or more of: Ta, Cr, W, V, Mo, Pt, Ru, Pd, Cu, Ag, Ru or alloys thereof; and
   the magnetic reference layer is located between the barrier layer and a buffer layer that comprises one or more of one or more of: Ta, Cr, W, V, Mo, Pt, Ru, Pd, Cu, Ag, Ru or alloys thereof.

8. The magnetic memory array as in claim 1, wherein the cylindrical semiconductor channel structure comprises Si.

9. The magnetic memory array as in claim 1, wherein the cylindrical semiconductor channel structure comprises monocrystalline Si.

10. The magnetic memory array as in claim 1, wherein the gate dielectric contacts the outer side of the cylindrical semiconductor channel structure.

11. The magnetic memory array as in claim 1, wherein the cylindrical semiconductor channel structure is formed over an n-doped semiconductor substrate.

12. The magnetic memory array as in claim 11, wherein the cylindrical semiconductor channel structure comprises mono-crystalline Si.

* * * * *